(12) United States Patent
Kondo et al.

(10) Patent No.: US 12,354,972 B2
(45) Date of Patent: Jul. 8, 2025

(54) SEMICONDUCTOR DEVICE

(71) Applicant: Kioxia Corporation, Tokyo (JP)

(72) Inventors: Naoyuki Kondo, Kamakura (JP);
Tsutomu Takahashi, Kawasaki (JP);
Shinichi Maruyama, Yokohama (JP);
Hiromitsu Harashima, Yokohama (JP);
Yuuichi Tatsumi, Setagaya (JP);
Yoshiko Kato, Yokohama (JP)

(73) Assignee: Kioxia Corporation, Tokyo (JP)

( * ) Notice: Subject to any disclaimer, the term of this patent is extended or adjusted under 35 U.S.C. 154(b) by 496 days.

(21) Appl. No.: 17/654,264

(22) Filed: Mar. 10, 2022

(65) Prior Publication Data

US 2023/0062595 A1 Mar. 2, 2023

(30) Foreign Application Priority Data

Sep. 2, 2021 (JP) .................. 2021-143514

(51) Int. Cl.
*H01L 23/00* (2006.01)
*H10B 43/10* (2023.01)
*H10B 43/27* (2023.01)
*H10B 43/40* (2023.01)

(52) U.S. Cl.
CPC ........... *H01L 23/562* (2013.01); *H10B 43/10* (2023.02); *H10B 43/27* (2023.02); *H10B 43/40* (2023.02)

(58) Field of Classification Search
CPC ....... H01L 23/562; H01L 23/34; H10B 43/10; H10B 43/27; H10B 43/40
See application file for complete search history.

(56) References Cited

U.S. PATENT DOCUMENTS

| 7,955,955 | B2 | 6/2011 | Lane et al. |
| 9,824,981 | B2 | 11/2017 | Yamada et al. |
| 10,692,786 | B1* | 6/2020 | Lin ...................... H01L 23/055 |
| 10,763,222 | B2 | 9/2020 | Jeong et al. |
| 10,833,100 | B2 | 11/2020 | Sugiura et al. |

(Continued)

FOREIGN PATENT DOCUMENTS

| JP | 2003-203882 A | 7/2003 |
| JP | 2011-018789 A | 1/2011 |

(Continued)

*Primary Examiner* — Herve-Louis Y Assouman
*Assistant Examiner* — Linda J. Fleck
(74) *Attorney, Agent, or Firm* — Oblon, McClelland, Maier & Neustadt, L.L.P.

(57) ABSTRACT

A semiconductor device according to an embodiment includes a semiconductor chip, a semiconductor element, a stacked body, and a structure body. The semiconductor chip includes a first surface, a second surface, and a side surface between the first surface and the second surface. The semiconductor element is provided in the center of the semiconductor chip when viewed from the normal direction of the first surface. The stacked body is provided at the outer peripheral end portion of the semiconductor chip when viewed from the normal direction and includes a plurality of first layers and a plurality of second layers alternately stacked in the normal direction. The structure body is provided in at least a part between the semiconductor element and the side surface when viewed from the normal direction and extending from a position higher than the stacked body to a position lower than the stacked body.

20 Claims, 20 Drawing Sheets

(56) References Cited

U.S. PATENT DOCUMENTS

| | | | |
|---|---|---|---|
| 2015/0069568 A1* | 3/2015 | Yamane | H10B 43/50 |
| | | | 257/499 |
| 2017/0148748 A1* | 5/2017 | Jeong | H10B 41/35 |
| 2019/0287932 A1* | 9/2019 | Hu | H01L 24/80 |
| 2020/0006255 A1* | 1/2020 | Nunokawa | H01L 23/3121 |
| 2020/0105600 A1 | 4/2020 | Lu et al. | |
| 2020/0243559 A1* | 7/2020 | Baek | H01L 29/66666 |
| 2021/0020501 A1 | 1/2021 | Ono et al. | |
| 2021/0082896 A1 | 3/2021 | Harashima et al. | |
| 2021/0313240 A1* | 10/2021 | Tanamachi | H01L 23/53295 |
| 2022/0108958 A1* | 4/2022 | Iwasa | H01L 23/10 |

FOREIGN PATENT DOCUMENTS

| | | |
|---|---|---|
| JP | 2015-128178 A | 7/2015 |
| JP | 2021-019180 A | 2/2021 |

\* cited by examiner

SEMICONDUCTOR DEVICE

CROSS REFERENCE TO RELATED APPLICATIONS

This application is based upon and claims the benefit of priority from the prior Japanese Patent Application No. 2021-143514, filed on Sep. 2, 2021, the entire contents of which are incorporated herein by reference.

FIELD

The embodiments of the present invention relate to a semiconductor device.

BACKGROUND

In a manufacture process for a semiconductor device, a wafer on which a semiconductor element is formed is sometimes singulated into semiconductor chips by dicing. However, a dicing failure such as a crack or chipping is likely to occur at the dicing time. The dicing failure is likely to adversely affect the semiconductor element and is likely to lead to a decrease in yield.

DETAILED DESCRIPTION

Figure 1:
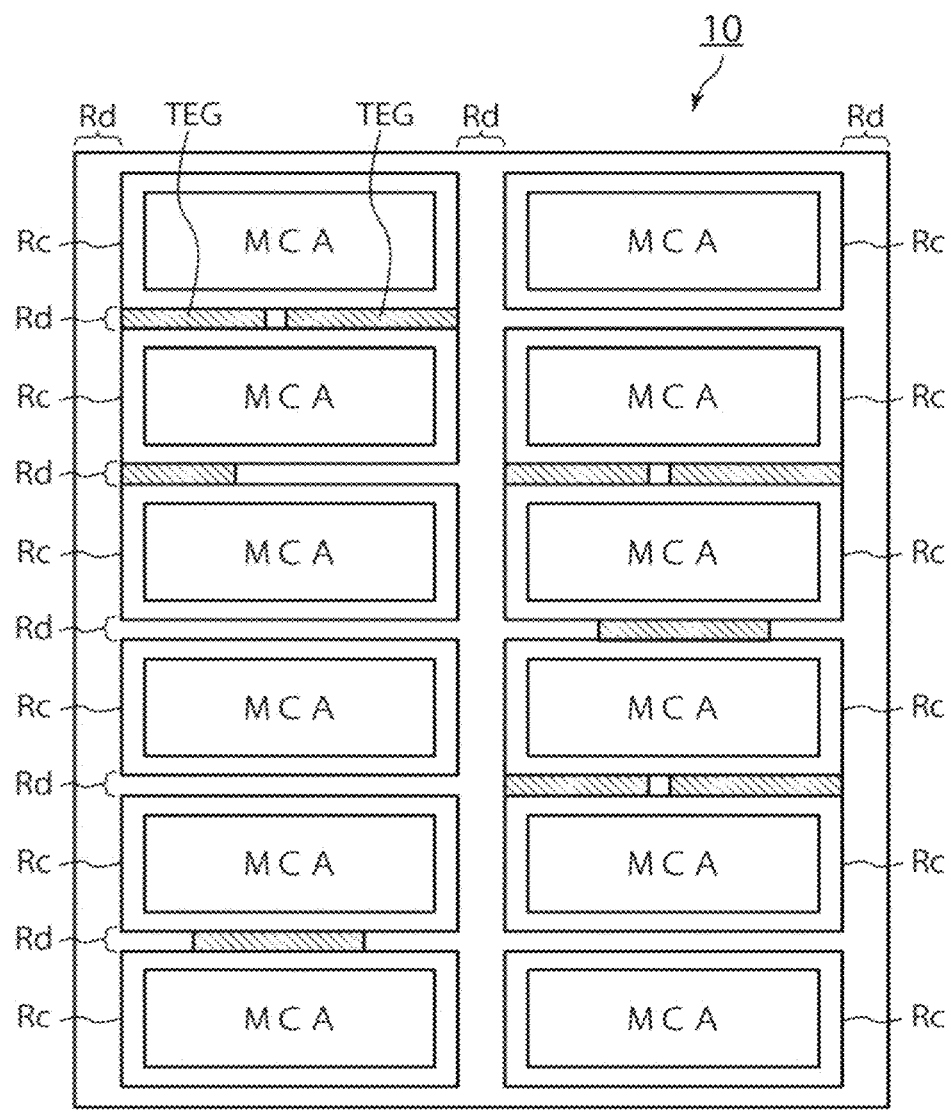
FIG. 1 is a plan view showing an example of a configuration of a part of a semiconductor wafer according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to an embodiment includes a semiconductor chip. The semiconductor chip includes a first surface, a second surface on the opposite side of the first surface, and a side surface between the first surface and the second surface. The semiconductor chip further includes a semiconductor element, a stacked body, a structure body. The semiconductor element is provided in the center of the semiconductor chip when viewed from the normal direction of the first surface. The stacked body is provided at the outer peripheral end portion of the semiconductor chip when viewed from the normal direction and includes a plurality of first layers and a plurality of second layers alternately stacked in the normal direction. The structure body is provided in at least a part between the semiconductor element and the side surface when viewed from the normal direction and extending from a position higher than the stacked body to a position lower than the stacked body.

In embodiments explained below, for example, a semiconductor storage device including a memory cell array in a three-dimensional structure will be explained as a semiconductor device. However, the semiconductor device according to the embodiments is not limited to this.

First Embodiment

FIG. 1 is a plan view showing an example of a configuration of a part of a semiconductor wafer 10 according to a first embodiment. The semiconductor wafer 10 is a substrate including a front surface on which a semiconductor element is formed and a rear surface on the opposite side of the front surface. FIG. 1 is a plan view of the front surface of the semiconductor wafer 10.

The semiconductor wafer 10 includes a plurality of chip regions Rc and a plurality of dicing regions Rd on the front surface thereof. The chip regions Rc are regions of semiconductor chips each singulated as semiconductor chips in a later dicing process. Chip patterns are provided in the chip regions Rc. In this embodiment, the chip patterns include, for example, memory cell arrays MCA. Control circuits that control the memory cell arrays MCA are provided under the memory cell arrays MCA and are not shown in FIG. 1.

The dicing regions Rd are provided among a plurality of chip regions Rc adjacent to one another and are cut (removed) in order to singulate the chip regions Rc in the later dicing process. Test patterns TEG are provided in the dicing regions Rd.

Figure 2:
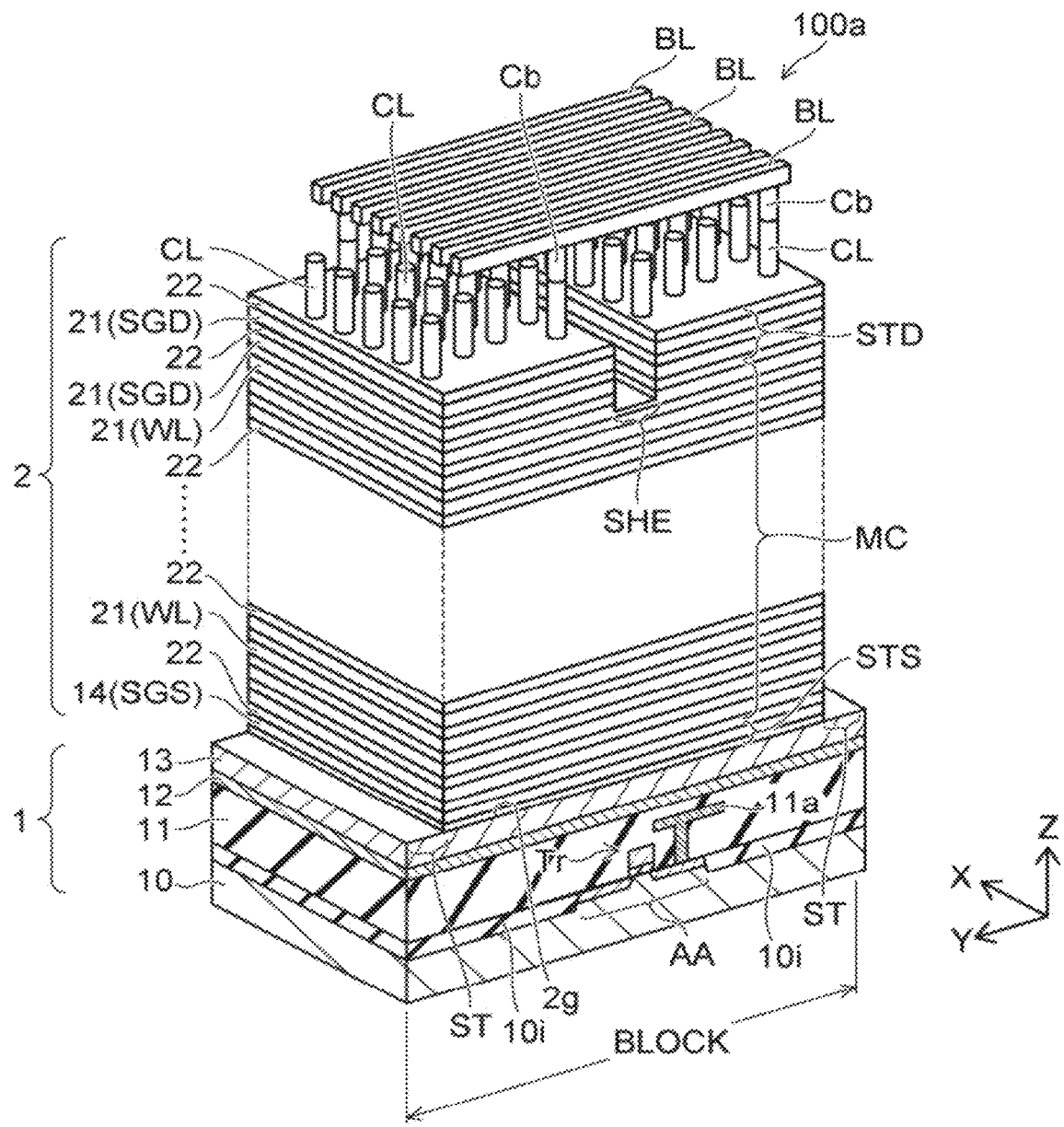
FIG. 2 is a perspective view illustrating a semiconductor device according to the first embodiment.
Figure 3:
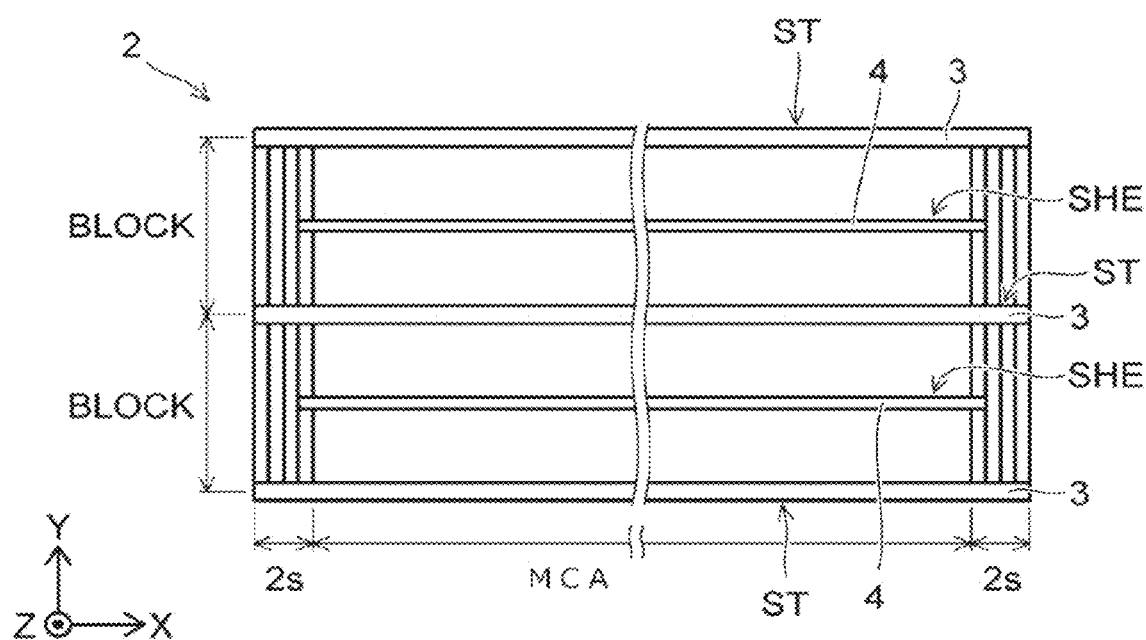
FIG. 3 is a plan view showing a stacked body.
Figure 4:
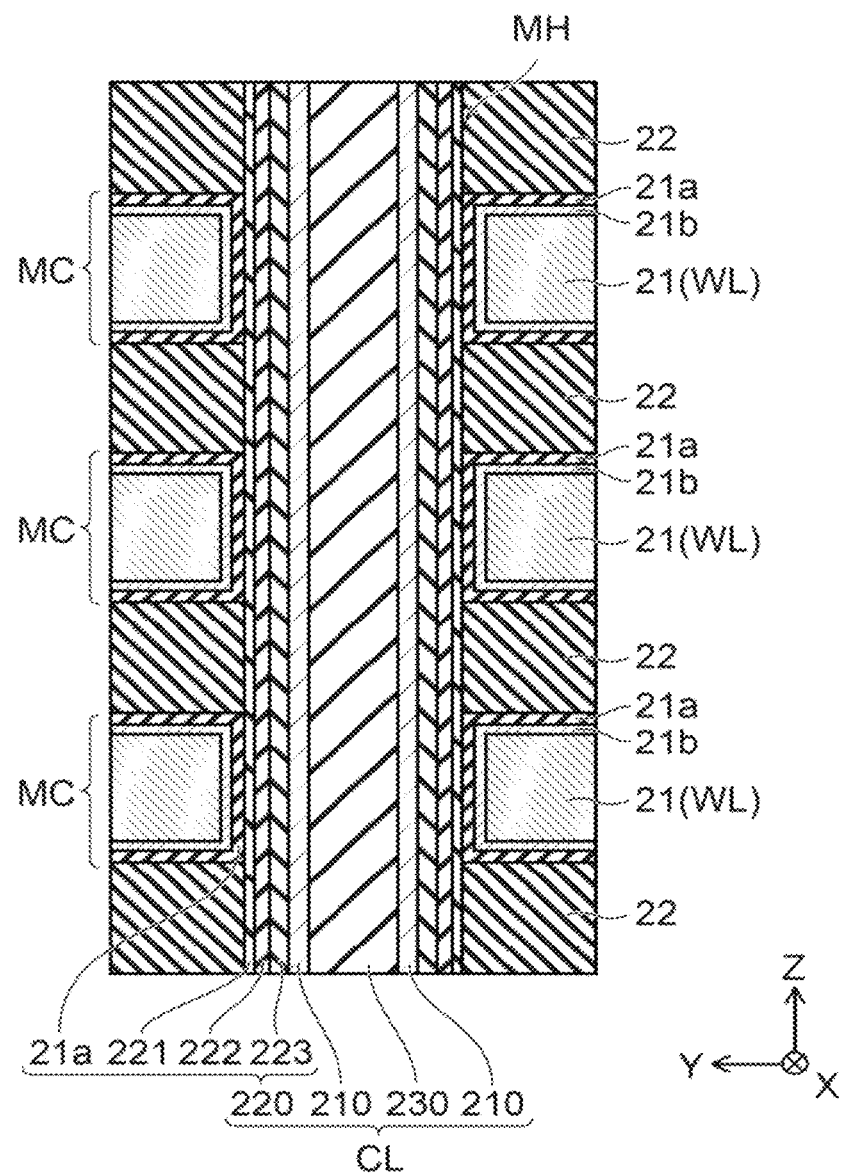
FIG. 4 is a sectional view showing an example of memory cells in a three-dimensional structure.
Figure 5:
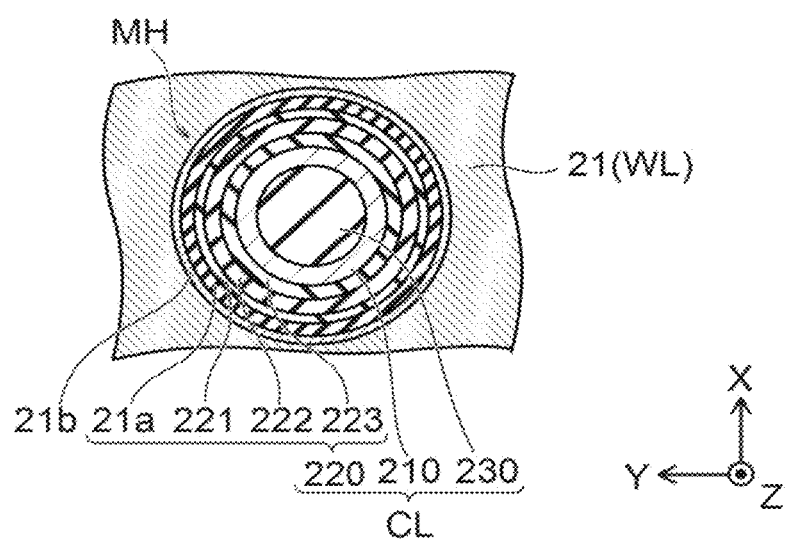
FIG. 5 is a sectional view showing an example of a memory cell in the three-dimensional structure.
Figure 6:
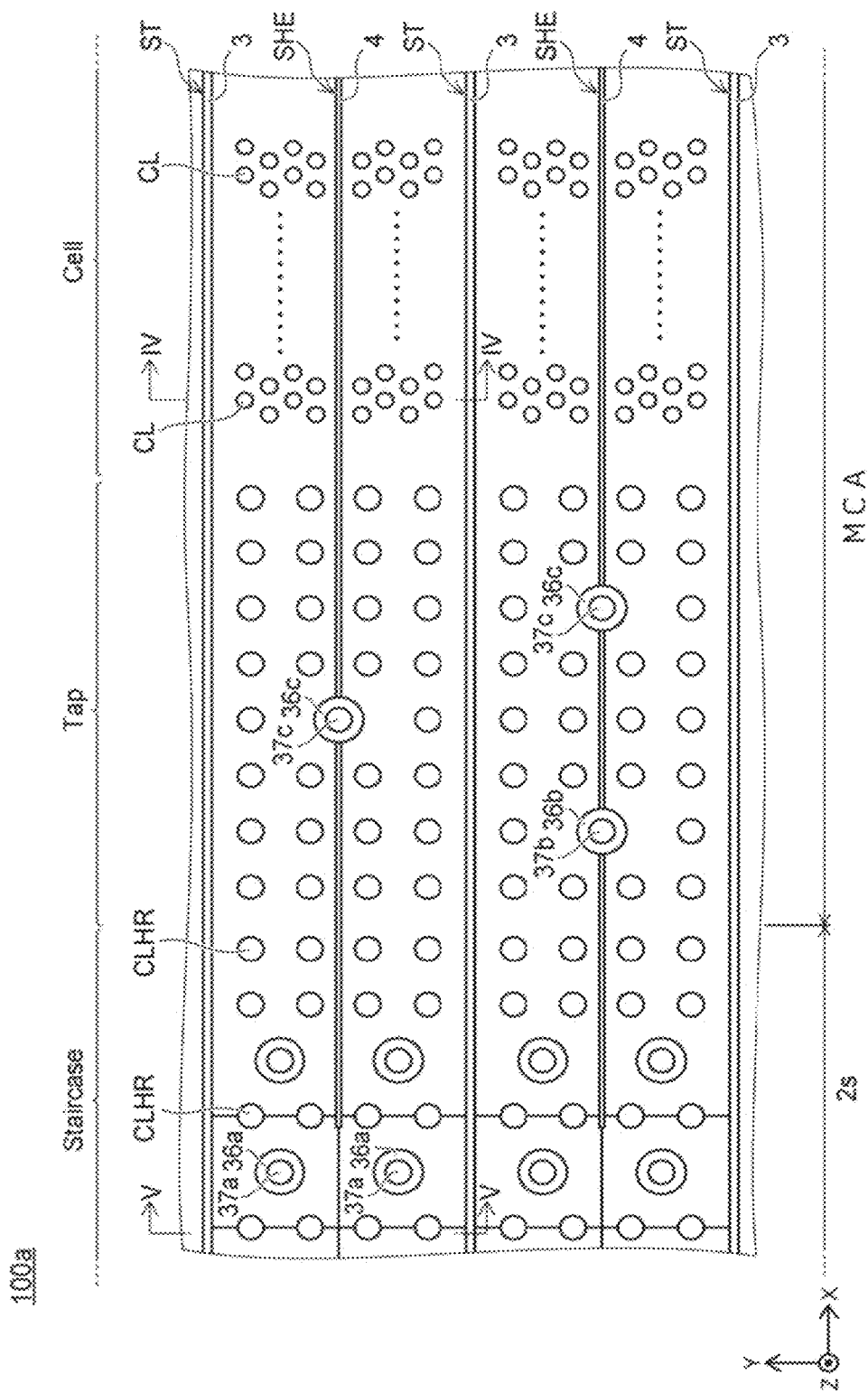
FIG. 6 is a plan view showing an example of the semiconductor device according to the first embodiment.

FIG. 2 is a perspective view illustrating a semiconductor device 100a according to the first embodiment. FIG. 3 is a plan view showing a stacked body 2. In this specification, a stacking direction of the stacked body 2 is represented as a Z-axis direction. One direction orthogonal to the Z-axis direction is represented as a Y-axis direction. A direction orthogonal to each of the Z-axis direction and the Y-axis direction is represented as an X-axis direction. Each of FIGS. 4 and 5 is a sectional view showing an example of a memory cell in a three-dimensional structure. FIG. 6 is a plan view showing an example of the semiconductor device 100a according to the first embodiment. As shown in FIGS. 2 to 6, the semiconductor device 100a according to the first embodiment is a nonvolatile memory including a memory cell array in a three-dimensional structure. The semiconductor device 100a is a structure provided in the chip region Rc. However, the semiconductor device 100a may be provided in the test pattern TEG and interpreted as a test structure.

The semiconductor device 100a includes a base section 1, the stacked body 2, plate-like sections 3, a plurality of columnar sections CL, and a plurality of columnar sections CLHR.

The base section 1 includes the semiconductor wafer (a substrate) 10, an insulating film 11, a conductive film 12, and a semiconductor section 13. The insulating film 11 is provided on the semiconductor wafer 10. The conductive film 12 is provided on the insulating film 11. The semiconductor section 13 is provided on the conductive film 12. The semiconductor wafer 10 is, for example, a silicon wafer. A conduction type of the semiconductor wafer 10 is, for example, a p type. For example, an element separation region 10i is provided in a surface region of the semiconductor wafer 10. The element separation region 10i is, for example, an insulating region including a silicon oxide film and defines an active area AA in the surface region of the semiconductor wafer 10. A source region and a drain region of a transistor Tr are provided in the active area AA. The transistor Tr configures a CMOS (Complementary Metal Oxide Semiconductor) circuit as a control circuit for the nonvolatile memory. The insulating film 11 includes, for example, a silicon oxide film and insulates the transistor Tr. A wire 11a is provided in the insulating film 11. The wire 11a is electrically connected to the transistor Tr. The conductive film 12 includes conductive metal, for example, tungsten (W). The semiconductor section 13 includes, for example, an n-type silicon. A part of the semiconductor section 13 may include undoped silicon.

The stacked body 2 is located above the semiconductor section 13 in the Z-axis direction. The stacked body 2 is configured by alternately stacking a plurality of conductive layers 21 and a plurality of insulating layers 22 in the Z-axis direction. The conductive layers 21 include conductive metal, for example, tungsten. The insulating layers 22 include, for example, silicon oxide. The insulating layers 22 insulate the conductive layers 21 from one another. The number of stacked layers of each of the conductive layers 21 and the insulating layers 22 is optional. The insulating layers 22 may be, for example, gaps. For example, an insulating film 2g is provided between the stacked body 2 and the semiconductor section 13. The insulating film 2g includes, for example, a silicon oxide film. The insulating film 2g may include a high dielectric having a specific dielectric constant higher than a specific dielectric constant of the silicon oxide. The high dielectric may be oxide such as a hafnium oxide film.

The conductive layer 21 includes at least one source-side selection gate SGS, a plurality of word lines WL, and at least one drain-side selection gate SGD. The source-side selection gate SGS is a gate electrode of a source-side selection transistor STS. The word lines WL are gate electrodes of memory cells MC. The drain-side selection gate SGD is a gate electrode of a drain-side selection transistor STD. The source-side selection gate SGS is provided in a lower region of the stacked body 2. The drain-side selection gate SGD is provided in an upper region of the stacked body 2. The lower region indicates a region of the stacked body 2 on a close side to the base section 1. The upper region indicates a region of the stacked body 2 on a far side from the base section 1. The word lines WL are provided between the source-side selection gate SGS and the drain-side selection gate SGD.

The thickness in the Z-axis direction of the insulating layer 22 that insulates the source-side selection gate SGS and the word line WL among the plurality of insulating layers 22 may be set larger than, for example, the thickness in the Z-axis direction of the insulating layer 22 that insulates the word line WL and the word line WL. Further, a cover insulating film may be provided on the insulating layer 22 in the top layer most separated from the base section 1. The cover insulating film includes, for example, silicon oxide.

The semiconductor device 100a includes a plurality of memory cells MC connected in series between the source-side selection transistor STS and the drain-side selection transistor STD. A structure in which the source-side selection transistors STS, the memory cells MC, and the drain-side selection transistors STD are connected in series is called "memory string" or "NAND string". The memory string is connected to bit lines BL via contacts Cb, for example. The bit lines BL are provided above the stacked body 2 and extend in the Y-axis direction.

In the stacked body 2, as shown in FIG. 3, a plurality of deep slits ST and a plurality of shallow slits SHE are provided. The slits ST extend in the X-axis direction in a plane layout. The slits ST pierce through the stacked body 2 from the upper end of the stacked body 2 to the base section 1 in a cross section in a Z direction (the stacking direction) and are provided in the stacked body 2. The plate-like sections 3 shown in FIG. 3 are provided in the slits ST. An insulating film such as a silicon oxide film is used for the plate-like sections 3. The plate-like sections 3 are configured by conductive metal such as a conductor (for example, tungsten or copper) electrically connected to the semiconductor section 13 and is electrically insulated from the stacked body 2 by an insulating film. The slits SHE extend in the X-axis direction substantially in parallel to the slits ST in the plane layout. The slits SHE are provided from the upper end of the stacked body 2 to halfway in the stacked body 2 in the cross section in the Z direction. For example, insulators 4 are provided in the slits SHE. An insulating film such as a silicon oxide film is used for the insulators 4.

The stacked body 2 includes, as shown in FIG. 3, staircase portions 2s and a memory cell array MCA. The staircase portions 2s are provided at edge portions of the stacked body 2. The memory cell array MCA is sandwiched or surrounded by the staircase portions 2s. The slits ST are provided from the staircase portion 2s at one end of the stacked body 2 to the staircase portion 2s at the other end of the stacked body 2 through the memory cell array MCA. The slits SHE are provided in at least the memory cell array MCA.

A portion of the stacked body 2 sandwiched by two slits ST (plate-like sections 3) is called a block BLOCK. The block configures, for example, a minimum unit of data erasing. The slit SHE (the insulator 4) is provided in the block. The stacked body 2 between the slit ST and the slit SHE is called a finger. The drain-side selection gate SGD is divided for each finger. Accordingly, at data write and readout times, one finger in the block can be brought into a selected state by the drain-side selection gate SGD.

As shown in FIG. 6, the memory cell array MCA includes a cell region (Cell) and a tap region (Tap). The staircase portion 2s includes a staircase region (Staircase). The tap region is provided, for example, between the cell region and the staircase region. Although not shown in FIG. 6, the tap region may be provided between cell regions. The staircase region is a region where a plurality of wires 37a are provided. The tap region is a region where wires 37b and 37c are provided. Each of the wires 37a to 37c extends in, for example, the Z-axis direction. The wires 37a are each, for example, electrically connected to the conductive layers 21. The wires 37b are, for example, electrically connected to the wire 11a for, for example, power supply to the transistor Tr. The wires 37c are, for example, electrically connected to the conductive film 12. Low resistance metal such as copper or tungsten is used for the wires 37a to 37c.

Insulating films 36a to 36c are respectively provided around the wires 37a to 37c. The insulating films 36a to 36c are provided between the wires 37a to 37c and the stacked body 2 and electrically insulate the wires 37a to 37c and the stacked body 2. Consequently, the wires 37a to 37c can electrically connect wires and the like present above the stacked body 2 to wires and the like present below the stacked body 2 while being insulated from the stacked body 2. An insulating film such as a silicon oxide film is used for the insulating film 36a to 36c. Note that the insulating film 36b and the wire 37b configure a contact C4 provided in the tap region.

Each of the plurality of columnar sections CL is provided in a memory hole MH provided in the stacked body 2. The memory hole MH pierces through the stacked body 2 from the upper end of the stacked body 2 along the stacking direction of the stacked body 2 (the Z-axis direction) and extends into the stacked body 2 and the semiconductor section 13. Each of the plurality of columnar sections CL includes, as shown in FIGS. 4 and 5, a semiconductor body 210, a memory film 220, and a core layer 230. The semiconductor body 210 is electrically connected to the semiconductor section 13. The memory film 220 includes a charge capture section between the semiconductor body 210 and the conductive layers 21. The plurality of columnar sections CL selected one by one each from fingers are connected in common to one bit line BL via the contacts Cb. Each of the columnar sections CL is provided in, for example, the cell region (Cell) shown in FIG. 6.

As shown in FIGS. 4 and 5, the shape of the memory hole MH in an X-Y plane is, for example, a circle or an ellipse. Block insulating films 21a configuring a part of the memory film 220 may be provided between the conductive layers 21 and the insulating layers 22. The block insulating films 21a are, for example, silicon oxide films or metal oxide films. An example of metal oxide is aluminum oxide. Barrier films 21b may be provided between the conductive layers 21 and the insulating layers 22 and between the conductive layers 21 and the memory film 220. For example, when the conductive layers 21 are tungsten, for example, a stacked structure film of titanium nitride and titanium is selected for the barrier films 21b. The block insulating films 21a suppress back tunneling of electric charges from the conductive layers 21 to the memory film 220 side. The barrier films 21b improve adhesion between the conductive layers 21 and the block insulating films 21a.

The shape of the semiconductor body 210 is, for example, a tubular shape. The semiconductor body 210 includes, for example, silicon. The silicon is, for example, polysilicon obtained by crystallizing amorphous silicon. The semiconductor body 210 is, for example, undoped silicon. The semiconductor body 210 may be p-type silicon. The semiconductor body 210 becomes a channel for each of the drain-side selection transistor STD, the memory cell MC, and the source-side selection transistor STS.

The memory film 220 is provided between the inner wall of the memory hole MH and the semiconductor body 210. The shape of the memory film 220 is, for example, a tubular shape. The plurality of memory cells MC include storage regions between the semiconductor body 210 and the conductive layers 21 to be the word lines WL and are stacked in the Z-axis direction. The memory film 220 includes, for example, a cover insulating film 221, a charge capture film 222, and a tunnel insulating film 223. Each of the semiconductor body 210, the charge capture film 222, and the tunnel insulating film 223 extends in the Z-axis direction.

The cover insulating film 221 is provided between the conductive layers 21 and the insulating layers 22 and the charge capture film 222. For example, silicon oxide is used for the cover insulating film 221. The cover insulating film 221 protects the charge capture film 222 not to be etched when a sacrificial film (not shown) is replaced with the conductive layers 21. The cover insulating film 221 may be removed from between the conductive layers 21 and the memory film 220 in a replacement process. In this case, as shown in FIGS. 4 and 5, for example, the block insulating films 21a are provided between the conductive layers 21 and the charge capture film 222. When the replacement process is not used for the formation of the conductive layers 21, the cover insulating film 221 may not be provided.

The charge capture film 222 is provided between the cover insulating film 221 and the tunnel insulating film 223. The charge capture film 222 includes, for example, silicon nitride and includes a trap site for trapping electric charges in the film. Portions of the charge capture film 222 sandwiched between the conductive layers 21 to be the word lines WL and the semiconductor body 210 configure storage regions of the memory cells MC as charge capture sections. A threshold voltage of the memory cells MC changes according to presence or absence of electric charges in the charge capture sections or an amount of electric charges captured in the charge capture sections. Consequently, the memory cells MC can retain information.

The tunnel insulating film 223 is provided between the semiconductor body 210 and the charge capture film 222. For example, silicon oxide or the silicon oxide and silicon nitride are used for the tunnel insulating film 223. The tunnel insulating film 223 is a potential barrier between the semiconductor body 210 and the charge capture film 222. For example, when electrons are injected into the charge capture sections from the semiconductor body 210 (a write operation) and when holes are injected into the charge capture sections from the semiconductor body 210 (an erase operation), the electrons and the holes each pass (tunnel) through the potential barrier wall of the tunnel insulating film 223.

The core layer 230 fills an internal space of the tubular semiconductor body 210. The shape of the core layer 230 is, for example, a columnar shape. An insulating film such as a silicon oxide film is used for the core layer 230.

Each of the plurality of columnar sections CLHR is provided in a hole HR provided in the stacked body 2. The hole HR pierces through the stacked body 2 from the upper end of the stacked body 2 along the Z-axis direction and is provided to the insides of the stacked body 2 and the semiconductor section 13. An insulator such as a silicon oxide film is used for the columnar sections CLHR. Each of the columnar sections CLHR may have the same structure as the structure of the columnar section CL. Each of the columnar sections CLHR is provided in, for example, the staircase region (Staircase) and the tap region (Tap). When sacrificial films 23 are replaced with the conductive layers 21 (a replacement process), the columnar sections CLHR function as supporting members for keeping air gaps formed in the staircase region and the tap region.

As shown in FIG. 2, the semiconductor device 100a further includes a semiconductor section 14. The semiconductor section 14 is located between the stacked body 2 and the semiconductor section 13. The semiconductor section 14 is provided between the insulating layer 22 closest to the semiconductor section 13 among the insulating layers 22 and the insulating film 2g. A conduction type of the semiconductor section 14 is, for example, an n type. The semiconductor section 14 functions as, for example, the source-side selection gate SGS.

Figure 7:
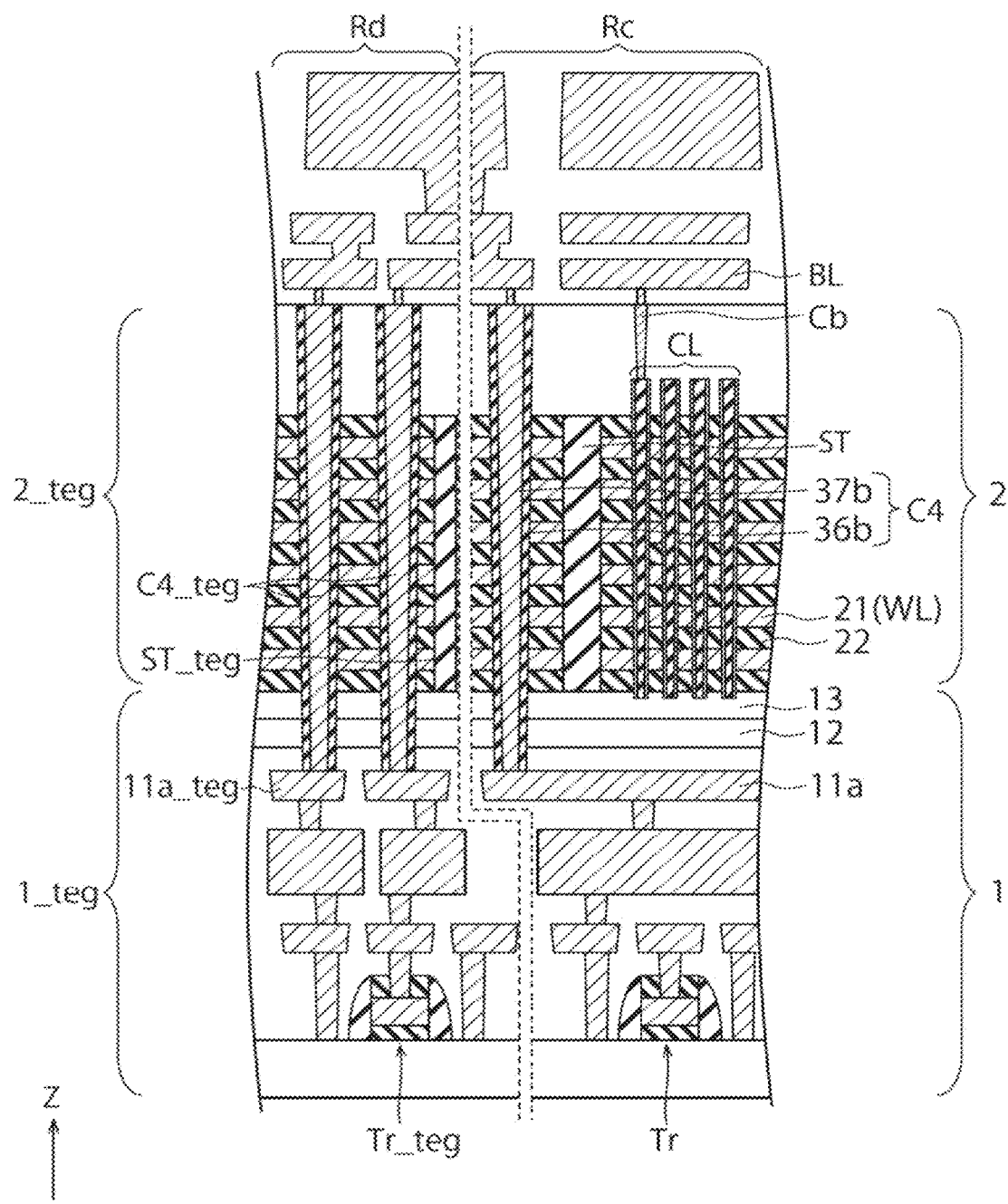
FIG. 7 is a sectional view showing an example of configurations of a chip region and a dicing region.

FIG. 7 is a sectional view showing an example of configurations of the chip region Rc and the dicing region Rd. For convenience, in the chip region Rc shown in FIG. 7, the columnar sections CL, the slit ST, and the contact C4 included in the memory cell array MCA are displayed side by side. In the dicing region Rd shown in FIG. 7, a slit ST_teg and contacts C4-teg included in the test pattern TEG are displayed side by side.

In the chip region Rc, the transistor Tr included in the CMOS circuit is provided in the base section 1. A multilayer wiring structure including the wire 11a is provided on the transistor Tr. The conductive film 12 and the semiconductor section 13 are provided on the wire 11a.

As explained above, the stacked body 2 is provided above the base section 1. In the stacked body 2 of the chip region Rc, the columnar sections CL explained above extend from above the stacked body 2 to the semiconductor section 13 in the stacking direction of the conductive layers 21 and the insulating layers 22 (the Z direction). The semiconductor bodies 210 (FIG. 4) of the plurality of columnar sections CL in the same finger are each electrically connected to the bit lines BL different from one another via the contact Cb. Consequently, when one word line WL is selected, data in a finger selected by the drain-side selection gate SGD is read out via the bit lines BL. Alternatively, data is written in the memory cells MC in the selected finger via the bit lines BL.

The slit ST pierces through the stacked body 2 from the upper end of the stacked body 2 to the base section 1 and is provided in the stacked body 2.

The contact C4 extends in the stacking direction of the stacked body 2 in the stacked body 2 and pierces through the stacked body 2, the semiconductor section 13, and the conductive film 12 from above the stacked body 2 to the wire 11a of the base section 1. The contact C4 electrically connects a power supply wire present above the stacked body 2 to the wire 11a and is electrically connected to the CMOS circuit including the transistor Tr via the wire 11a. For example, the contact C4 may be a power supply contact provided in order to supply electric power to the CMOS circuit. As explained above, the contact C4 is configured by the wire 37b and the insulating film 36b. The insulating film 36b is provided between the conductive layer 21 and the wire 37b in the stacked body 2 and covers the periphery of the wire 37b. Since the insulating film 36b covers the periphery of the wire 37b, wires and the like present above the stacked body 2 can be electrically connected to the wire 11a and the like present below the stacked body 2 with the wire 37b being kept insulated from the stacked body 2.

A transistor Tr_teg included in the test pattern TEG is provided in a base section 1_teg in the dicing region Rd. The transistor Tr_teg configures a part of the CMOS circuit of the test pattern TEG. A multilayer wiring structure including wires 11a_teg is provided on the transistor Tr_teg. The conductive film 12 and the semiconductor section 13 are provided on the wires 11a_teg.

A stacked body 2_teg is provided above the base section 1_teg. The stacked body 2_teg has the same configuration as the configuration of the stacked body 2. That is, the stacked body 2_teg is provided above the transistor Tr_teg and is configured by alternately stacking the plurality of insulating layers 22 and the plurality of conductive layers 21. The slit ST_teg and contacts C4_teg are provided in the stacked body 2_teg.

The slit ST_teg has the same configuration as the configuration of the slit ST. That is, the slit ST_teg pierces through the stacked body 2_teg from the upper end of the stacked body 2_teg to the base section 1_teg in the dicing region Rd and is provided in the stacked body 2_teg. An insulating film such as a silicon oxide film is embedded in the slit ST_teg.

The contacts C4_teg extend in a stacking direction of the stacked body 2_teg in the dicing region Rd and pierce through the stacked body 2_teg, the semiconductor section 13, and the conductive film 12 from above the stacked body 2_teg to the wires 11a_teg of the base section 1_teg. The contacts C4_teg are provided, for example, in order to electrically connect a power supply wire present above the stacked body 2_teg to the wires 11a_teg and supply electric power to the CMOS circuit including the transistor Tr_teg. The contacts C4_teg have the same configuration as the configuration of the contact C4. That is, the contacts C4_teg are configured by the wire 37b and the insulating film 36b that covers the periphery of the wire 37b. Consequently, the contacts C4_teg can electrically connect wires present above the stacked body 2_teg to the wires 11a_teg present below the stacked body 2_teg with the wire 37b being kept insulated from the stacked body 2_teg.

According to this embodiment, as shown in FIG. 7, the stacked body 2_teg is provided in the test pattern TEG of the dicing region Rd as well. The stacked body 2_teg has the same configuration as the stacked body 2 of the chip region Rc and is provided around the contacts C4_teg having the same configuration as the configuration of the contact C4. Accordingly, the transistor Tr_teg of the test pattern TEG can be tested in substantially the same environment as the environment of the transistor Tr of the chip region Rc. Therefore, by measuring the transistor Tr_teg, it is possible to detect characteristics of the transistor Tr present below the stacked body 2 (the memory cell array MCA). As a result, it is possible to detect influence of the stacked body 2 on the transistor Tr.

Next, details of a configuration near a boundary between the memory cell array MCA and the test pattern TEG will be explained.

Figure 8:
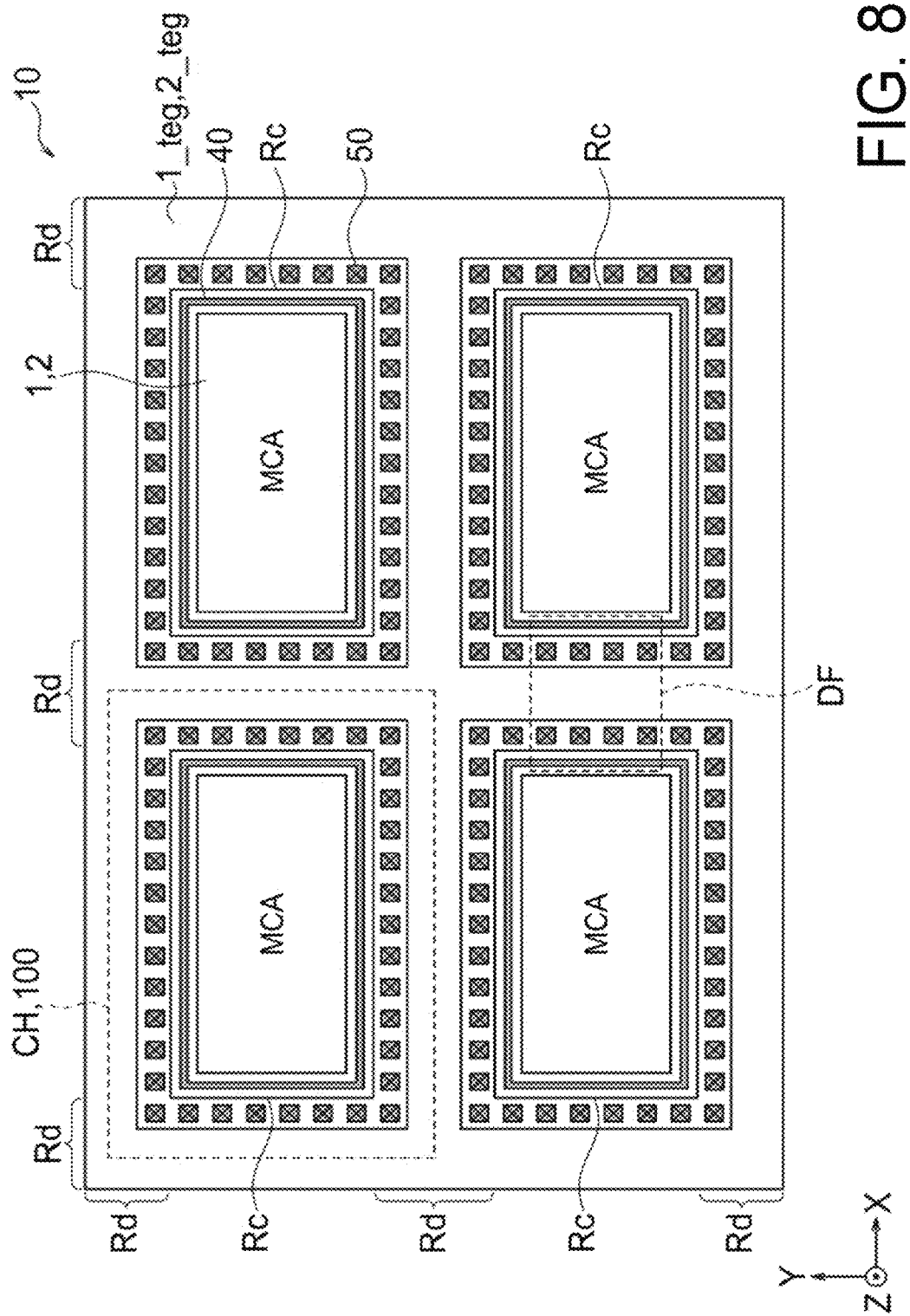
FIG. 8 is a plan view showing an example of a configuration of a part of the semiconductor wafer according to the first embodiment.

FIG. 8 is a plan view showing an example of a configuration of a part of the semiconductor wafer 10 according to the first embodiment. FIG. 8 shows the semiconductor wafer 10 before being singulated into semiconductor chips CH. The semiconductor device 100 according to the first embodiment includes, for example, the semiconductor chips CH after singulation.

In the example shown in FIG. 8, the chip regions Rc and the dicing regions Rd corresponding to FIG. 1 are shown. Note that, in the example shown in FIG. 8, four chip regions Rc (semiconductor chips CH) are shown. Singulation of the semiconductor chips CH is performed by performing die cut along the dicing regions Rd. The singulation is performed by, for example, blade dicing. However, as explained below, the singulation is not limited to the blade dicing.

The semiconductor chip CH includes a surface F1, a surface F2, and a side surface Fs. The surface F1 is a surface on which a semiconductor element is provided. The surface F2 is a surface on the opposite side of the surface F1. The side surface Fs is a side surface between the surface F1 and the surface F2. The side surface Fs corresponds to a cut surface at the time of the singulation. FIG. 8 is a view of the semiconductor wafer 10 viewed from the surface F1 side.

The semiconductor chip CH includes the semiconductor wafer 10 (a semiconductor substrate), the semiconductor element, the stacked body 2_teg, an edge seal section 40, and a structure body 50.

The semiconductor wafer 10 is, for example, a silicon wafer as explained above. The semiconductor element, the edge seal section 40, the stacked body 2_teg, and the structure body 50 are provided on the semiconductor substrate of the semiconductor substrate 10.

The semiconductor element is provided in, for example, the chip region Rc. The semiconductor element is, for example, the memory cell array MCA and the control circuit. As explained with reference to FIGS. 2 and 7, the control circuit is disposed below the memory cell array MCA. The semiconductor element is provided in the center of the semiconductor chip CH when viewed from the normal direction of the surface F1 (the Z direction).

The edge seal section 40 is provided in, for example, the chip region Rc. The edge seal section 40 is annularly provided to surround the outer periphery of the semiconductor element, for example, when viewed from the Z direction. The edge seal section 40 is square in FIG. 8. However, the edge seal section 40 may have another shape such as a hexagon or an octagon if the edge seal section 40 is substantially annular. Note that the edge seal section 40 is continuously provided to surround the semiconductor element. However, the edge seal section 40 may be divided into a plurality of sections to form gaps in a part of the edge seal section 40. The edge seal section 40 is provided between the semiconductor element and the structure body 50. As explained below with reference to FIGS. 9 and 10, the edge seal section 40 extends in the Z direction and extends along the outer periphery of the semiconductor element. That is, the edge seal section 40 has, for example, a plate-like shape and suppresses intrusion of contaminants such as impurities into the semiconductor element.

The stacked body 2_teg is provided in, for example, the dicing region Rd. The stacked body 2_teg is provided at the outer peripheral edge portion of the semiconductor chip CH when viewed from the Z direction. The stacked body 2_teg corresponds to the stacked body 2_teg shown in FIG. 7.

The structure body 50 is provided in, for example, the dicing region Rd. The structure body 50 is provided in at least a part between the semiconductor element and the side surface Fs when viewed from the Z direction. The structure body 50 is provided to cover the edge seal section 40 when viewed from the Z direction. As explained below with reference to FIG. 10, the structure body 50 extends in the Z direction. The structure body 50 functions as, for example, a crack stopper at a dicing time. Consequently, it is possible to suppress a crack or the like from intruding into the inside of the semiconductor chip CH from the side surface Fs of the semiconductor chip CH. As a result, it is possible to more appropriately perform the singulation.

The structure body 50 includes, for example, a plurality of columnar sections. The plurality of columnar sections are discontinuously disposed side by side to surround the outer periphery of the edge seal section 40 when viewed from the Z direction.

Figure 9:
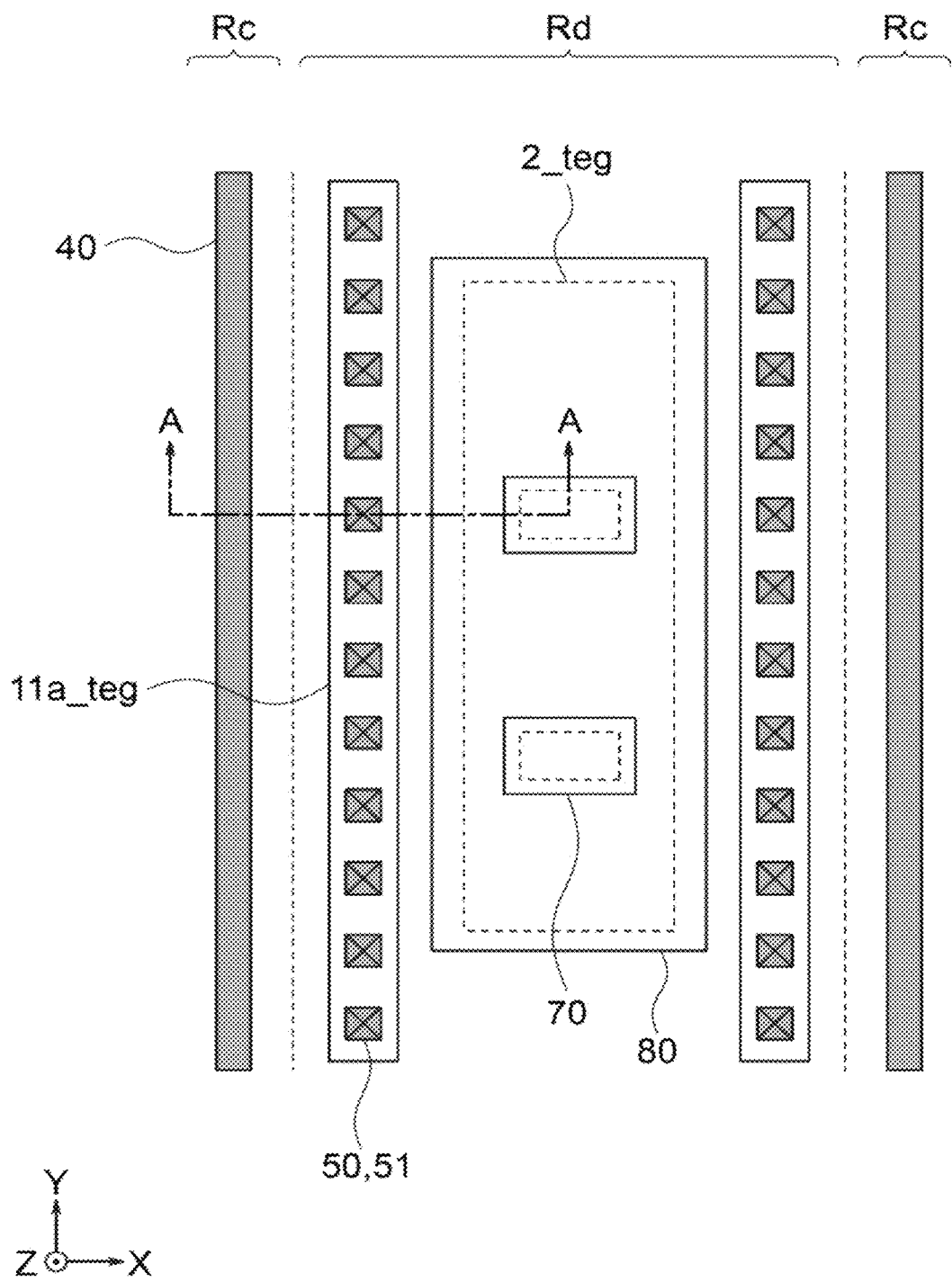
FIG. 9 is a plan view showing an example of a configuration of a part of the semiconductor wafer according to the first embodiment.
Figure 10:
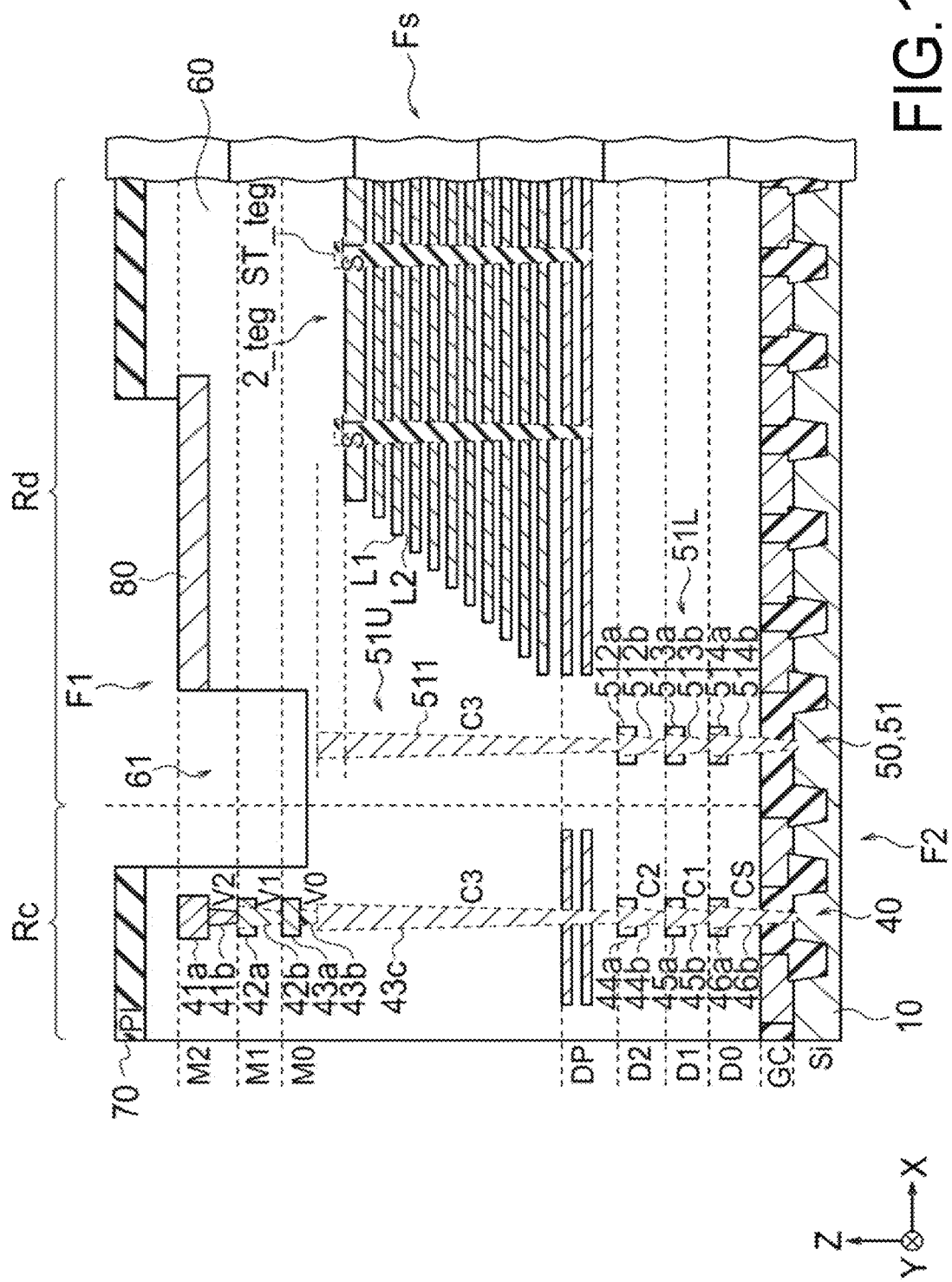
FIG. 10 is a sectional view showing an example of a configuration of a part of the semiconductor wafer according to the first embodiment.

FIG. 9 is a plan view showing an example of a configuration of a part of the semiconductor wafer 10 according to the first embodiment. FIG. 9 is an enlarged view of a region of a broken line frame DF shown in FIG. 8, which is a region near a boundary between the chip region Rc and the dicing region Rd. FIG. 10 is a sectional view showing an example of a configuration of a part of the semiconductor wafer 10 according to the first embodiment. Note that an A-A line in FIG. 9 indicates a cross section corresponding to FIG. 10, which is the sectional view.

Note that the semiconductor wafer 10 is, for example, cut at the right end of the dicing region Rd shown in FIG. 10 and singulated into the semiconductor chip CH. Therefore, the right end of the dicing region Rd shown in FIG. 10 corresponds to the side surface Fs of the semiconductor chip CH.

As shown in FIG. 10, the stacked body 2_teg includes a plurality of layers L1 and a plurality of layers L2 alternately stacked in the Z direction. A stacked structure of the stacked body 2_teg corresponds to a stacked structure of the memory cell array MCA as explained with reference to FIG. 7. For example, the layers L1 and the layers L2 of the stacked body 2_teg respectively correspond to the conductive layers 21 and the insulating layers 22 of the memory cell array MCA. The slit ST_teg shown in FIG. 7 is provided to pierce through the stacked body 2_teg.

The stacked body 2_teg is disposed to be exposed in at least a part of the side surface Fs, which is the cut surface.

As shown in FIG. 9, the edge seal section 40 is linearly provided along a boundary between the chip region Rc and the dicing region Rd. Therefore, in an example shown in FIG. 9, the edge seal section 40 extends in the Y direction.

As shown in FIG. 10, the edge seal section 40 extends in the Z direction. The edge seal section 40 includes wires 41a, 42a, 43a, 44a, 45a, and 46a and vias 41b, 42b, 43b, 44b, 45b, and 46b. The wires 41a, 42a, and 43a are respectively included in wiring layers M2, M1, and M0. The wires 44a, 45a, and 46a are respectively included in wiring layers D2, D1, and D0. Note that, for example, the bit lines BL shown in FIGS. 2 and 7 are included in the wiring layer M0. A via 43c corresponds to a contact C3 provided apart from the stacked bodies 2 and 2_teg.

As shown in FIG. 10, the structure body 50 extends from a position higher than the stacked body 2_teg to a position lower than the stacked body 2_teg.

In the singulation of the semiconductor wafer 10, for example, a crack or film peeling of the stacked body 2_teg sometimes occurs from the stacked body 2_teg near the cut surface. The structure body 50 leads the crack or the film peeling in the Z direction. Consequently, it is possible to suppress a dicing failure such as the crack or the film peeling from affecting the semiconductor element.

The structure body 50 includes a structure body 51 disposed between the semiconductor element and the stacked body 2_teg.

The structure body 51 includes an upper structure body 51U and a lower structure body 51L. The upper structure body 51U indicates a region on a far side from the semiconductor wafer 10 in the structure body 51. The lower structure body 51L indicates a region on a near side to the semiconductor wafer 10 in the structure body 51. The lower structure body 51L is disposed in a position lower than the stacked body 2_teg in the structure body 51.

The upper structure body 51U includes a via 511. The via 511 is provided such that the upper end of the via 511 is in a position higher than the stacked body 2_teg and the lower end of the via 511 is in a position lower than the stacked body 2_teg. The via 511 corresponds to the contact C3 provided apart from the stacked bodies 2 and 2_teg. Therefore, the via 511 is formed in the same process as a process for forming the contact C3. As shown in FIG. 9, vias 511, which are columnar sections, are, for example, discontinuously provided side by side in the Y direction. The material of the via 511 is conductive metal such as tungsten.

The lower structure body 51L includes vias 512b, 513b, and 514b and wires 512a, 513a, and 514a. The lower structure body 51L is included in the base section 1_teg shown in FIG. 7.

The vias 512b, 513b, and 514b functioning as one columnar section are, for example, discontinuously provided side by side in the Y direction like the vias 511. By providing the vias 512b, 513b, and 514b in a position lower than the stacked body 2_teg, it is easier to lead the crack or the film peeling in the Z direction. Consequently, it is possible to further suppress the crack or the film peeling from intruding into the semiconductor element. The material of the vias 512b, 513b, and 514b is conductive metal such as tungsten.

The wires 512a, 513a, and 514a are respectively included in the wiring layers D2, D1, and D0. The wires 512a, 513a, and 514a correspond to the wires 11a_teg shown in FIG. 7. As shown in FIGS. 9 and 10, the wires 512a, 513a, and 514a, which are the wires 11a_teg, connect, along the Y direction, the structure bodies 51 adjacent to one another. Consequently, it is possible to further suppress the crack or the film peeling from intruding into the semiconductor element. The material of the wires 512a, 513a, and 514a is conductive metal such as tungsten.

Therefore, the lower structure body 51L includes vias 512b, 513b, and 514b, which are columnar sections, and wires connecting the columnar sections (the vias 512b, 513b, and 514b) adjacent to one another. According to a combination of the columnar sections and the wires, the lower structure body 51L has, for example, a mesh shape when viewed from the X direction in FIGS. 9 and 10. Note that the wires 512a and 513a and the via 512b may have a via chain structure extending in the Y direction.

The semiconductor chip CH further includes an interlayer insulating film 60, a protection film 70, and a metal film 80.

The interlayer insulating film 60 is provided to cover the stacked body 2_teg and the structure body 50. The interlayer insulating film 60 is, for example, an insulating film. The interlayer insulating film 60 is, for example, a silicon oxide film or a stacked film including the silicon oxide film and another insulating film (for example, a silicon nitride film).

The interlayer insulating film 60 is formed using TEOS (Tetraethoxysilane) or the like.

The interlayer insulating film 60 includes a recess 61 above the structure body 51. When the crack or the film peeling reaches, for example, the structure body 51, the crack or the film peeling is led in the Z direction. The crack or the film peeling led upward in the structure body 51 is terminated in the recess 61 above the structure body 51. That is, by shaving a part of the interlayer insulating film 60 to form the recess 61, it is possible to terminate the crack or the film peeling at a shorter distance. As a result, it is possible to further suppress the crack or the film peeling from intruding into the semiconductor element.

The protection film 70 and the metal film 80 are provided to cover the stacked body 2_teg in the dicing region Rd.

The protection film 70 is provided on the upper surface of the interlayer insulating film 60. As shown in FIGS. 9 and 10, the protection film 70 is provided above the stacked body 2_teg. As shown in FIG. 9, the protection film 70 is provided to cover an opening of the metal film 80. The protection film 70 and the metal film 80 are complementarily (alternately) provided when viewed from the Z direction. The material of the protection film 70 is, for example, PI (Polyimide).

The metal film 80 is provided on the upper surface of the interlayer insulating film 60. As shown in FIGS. 9 and 10, the metal film 80 is provided above the stacked body 2_teg. As shown in FIG. 9, the metal film 80 is, for example, provided to cover the stacked body 2_teg. As shown in FIG. 10, the metal film 80 is provided in a position lower than the protection film 70. The metal film 80 is included in, for example, the wiring layer M2. The material of the metal film 80 is, for example, aluminum (Al).

The protection film 70 and the metal film 80 are not disposed above the structure body 51. That is, the protection film 70 and the metal film 80 are disposed apart from the structure body 51 when viewed from the Z direction.

The bottom surface of the recess 61 is, for example, lower than the wiring layer M2. The recess 61 is formed by, for example, RIE (Reactive Ion Etching). For example, the interlayer insulating film 60 formed above the structure body 51 and the metal film 80 is shaved by the RIE. After the metal film 80 is exposed, the recess 61 is formed according to a difference between etching rates of the interlayer insulating film 60 and the metal film 80. The depth of the recess 61 is determined according to, for example, an etching selection ratio between the interlayer insulating film 60 and the metal film 80.

As explained above, according to the first embodiment, the structure body 51 is provided in at least a part between the semiconductor element and the stacked body 2_teg. Consequently, it is possible to suppress the crack or the film peeling from intruding into the semiconductor element. That is, it is possible to suppress the influence of a dicing failure on the semiconductor element. As a result, it is possible to more appropriately perform the singulation.

The stacked body 2_teg is configured by alternately stacking two kinds of layers having different strengths. Consequently, the stacked body 2_teg is sometimes fragile in structure. When the stacked body 2_teg is diced, a dicing failure such as a crack or film peeling easily occurs. The crack or the film peeling is likely to easily advance along an XY plane perpendicular to the stacking direction. As shown in FIG. 10, the stacked body 2_teg is disposed to be separated upward from the semiconductor wafer 10 (the semiconductor substrate) in order to disposed the CMOS circuit. The interlayer insulating film 60 having strength lower than the strength of the stacked body 2_teg is present between the stacked body 2_teg and the semiconductor wafer 10. Consequently, in the stacked body 2_teg, the dicing failure such as the crack or the film peeling is likely to more easily occur. Therefore, it is preferable to provide the structure body 51 and suppress the influence of the dicing failure.

As shown in FIG. 10, the lower end of the structure body 51 reaches the semiconductor wafer 10. The via 514b is a contact Cs connected to the semiconductor wafer 10. Since the structure body 51 reaches the semiconductor wafer 10, it is possible to make it easy to allow the crack or the film peeling led downward in the structure body 51 to escape to the semiconductor wafer 10.

As shown in FIGS. 8 and 9, the structure body 51 is provided between the edge seal section 40 and the side surface Fs (the stacked body 2_teg) when viewed from the Z direction. Like the structure body 51, the edge seal section 40 can also suppress the crack or the film peeling from intruding into the semiconductor element. However, the edge seal section 40 is linearly provided when viewed from the Z direction in order to suppress intrusion of contaminants. That is, the edge seal section 40 is provided in, for example, a plate shape. In this case, the width of the edge seal section 40 is sometimes different depending on a position. The maximum width of the edge seal section 40 is sometimes larger than the diameter of a columnar section (a via) included in the structure body 51. Therefore, when the structure body 51 is a columnar section, the structure body 51 can be more compactly and efficiently formed than the edge seal section 40. Consequently, it is preferable to dispose the structure body 51, which is the columnar section, closer to the stacked body 2_teg than the edge seal section 40. Note that, as explained below with reference to a second modification of the first embodiment, the structure body 51 is not limited to the columnar section and may be a plate-like section.

Note that the singulation is not limited to the blade dicing. That is, the first embodiment is applicable irrespective of a singulation method. For example, in stealth dicing, it is likely that a dicing failure such as a crack or film peeling occurs from the stacked body 2_teg in a cleavage process after formation of a modified layer. By providing the structure body 51, it is possible to suppress the crack or the film peeling from intruding into the semiconductor element.

The structure body 51 does not always have to include the lower structure body 51L.

First Modification of the First Embodiment

Figure 11:
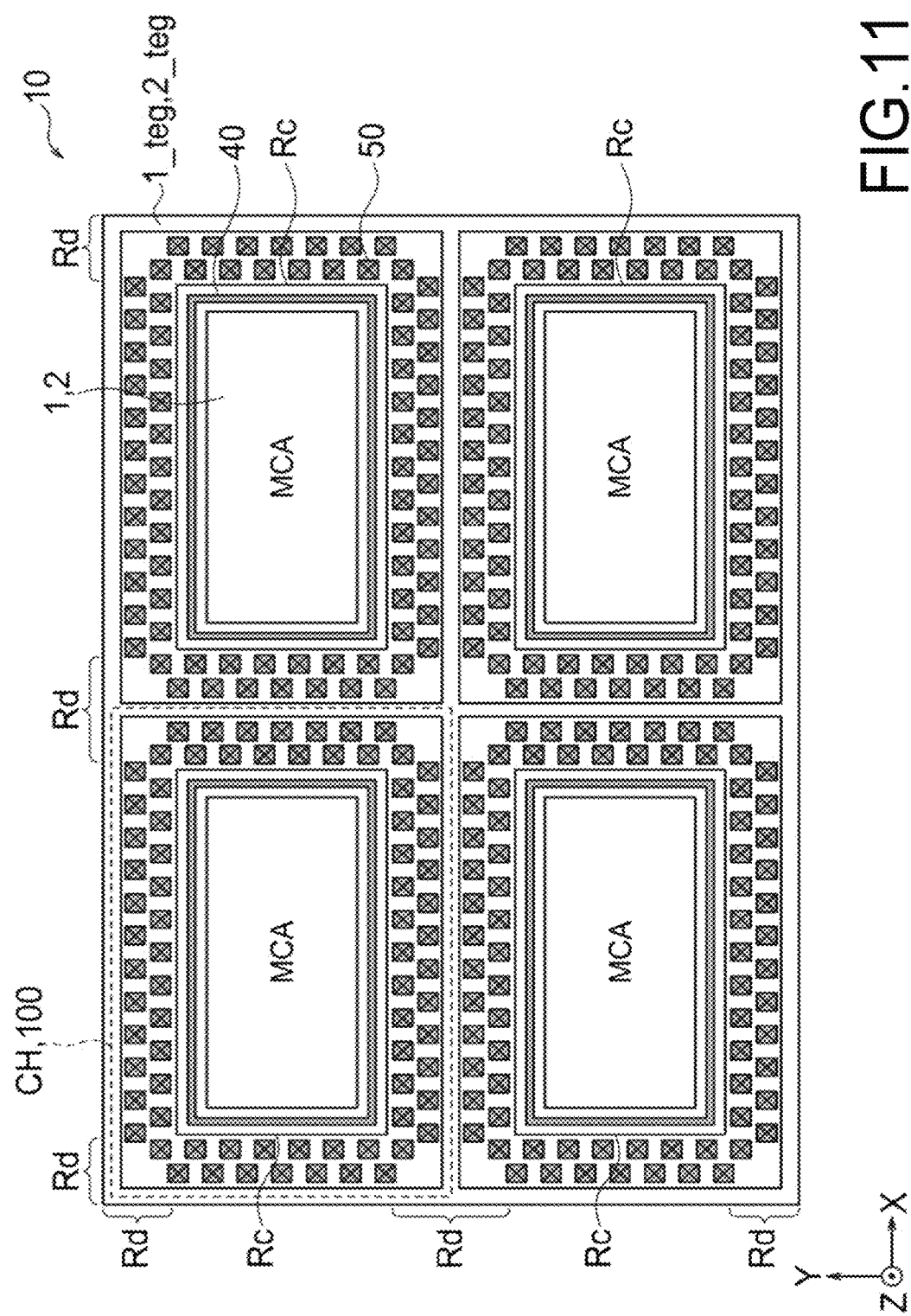
FIG. 11 is a plan view showing an example of a configuration of a part of a semiconductor wafer according to a first modification of the first embodiment.

FIG. 11 is a plan view showing an example of a configuration of a part of the semiconductor wafer 10 according to a first modification of the first embodiment. The first modification of the first embodiment is different from the first embodiment in that structure bodies 50, which are the columnar sections, are arrayed in a plurality of rows.

The structure bodies 50, which are the columnar sections, are disposed in a plurality of rows along the outer periphery of the semiconductor element when viewed from the Z direction. In the example shown in FIG. 11, the structure bodies 50 are disposed in two rows. Consequently, it is possible to further suppress the crack or the film peeling from intruding into the semiconductor element. Note that the structure bodies 50 may be arrayed in three or more rows.

The structure bodies 50 are disposed in zigzag. That is, the structure bodies 50, which are the columnar sections, are disposed to be alternate along the outer periphery of the semiconductor element between rows adjacent to each other when viewed from the Z direction.

Consequently, it is possible to further suppress the crack or the film peeling from intruding into the semiconductor element.

The vias 512b, 513b, and 514b in the lower structure body 51L may also be provided in a plurality of rows as shown in FIG. 11.

The semiconductor device 100 according to the first modification of the first embodiment can obtain the same effects as the effects in the first embodiment.

Second Modification of the First Embodiment

Figure 12:
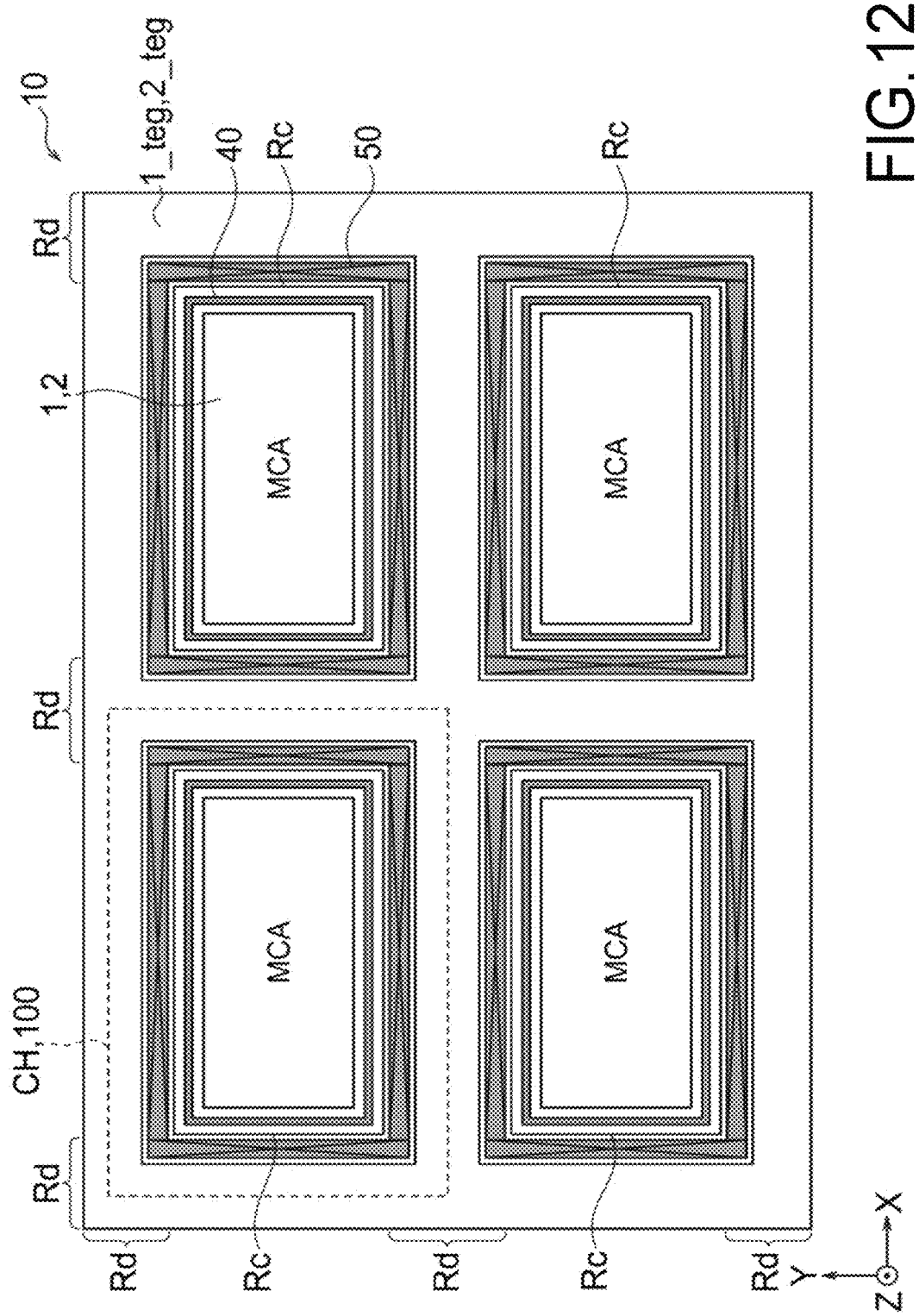
FIG. 12 is a plan view showing an example of a configuration of a part of a semiconductor wafer according to a second modification of the first embodiment.

FIG. 12 is a plan view showing an example of a configuration of a part of the semiconductor wafer 10 according to a second modification of the first embodiment. The second modification of the first embodiment is different in the shape of the structure body 50 compared with the first embodiment.

As shown in FIG. 12, the structure body 50 is linearly provided in the X direction or the Y direction parallel to the surface F1. That is, the structure body 50 includes a plate-like section extending in the Z direction and extending along the outer periphery of the semiconductor element. In this case, the via 511, which is the plate-like section, shown in FIG. 10 extends in, for example, the Y direction. The plate-like section is continuously provided to surround the outer periphery of the edge seal section 40. However, the plate-like section may be divided into a plurality of sections to form gaps in a part of the plate-like section. In this case, the structure body 50 includes a plurality of plate-like sections.

The vias 512b, 513b, and 514b in the lower structure body 51L may also include plate-like sections as shown in FIG. 12.

The semiconductor device 100 according to the second modification of the first embodiment can obtain the same effects as the effects in the first embodiment. The first modification of the first embodiment may be combined with the semiconductor device 100 according to the second modification of the first embodiment. In this case, the structure body 50 includes double plate-like sections along the outer periphery of the semiconductor element.

Second Embodiment

Figure 13:
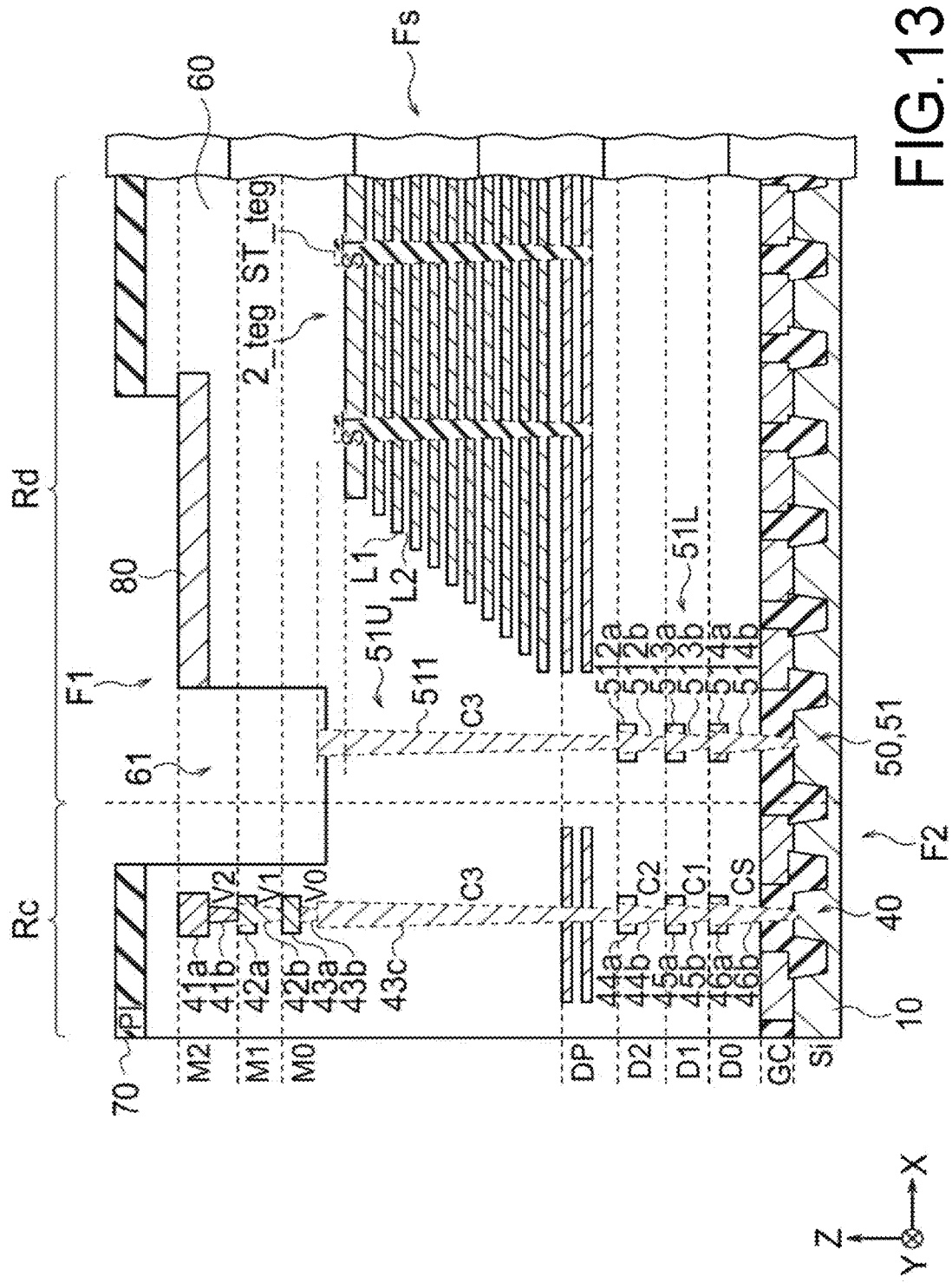
FIG. 13 is a sectional view showing an example of a configuration of a part of a semiconductor wafer according to a second embodiment.

FIG. 13 is a sectional view showing an example of a configuration of a part of the semiconductor wafer 10 according to a second embodiment. The second embodiment is different from the first embodiment in that the structure body 51 projects from the interlayer insulating film 60 of the surface F1.

The recess 61 shown in FIG. 13 is deeper than the recess 61 shown in FIG. 10 in the first embodiment. Consequently, the upper end of the structure body 51 is exposed from the interlayer insulating film 60. As a result, it is possible to make it easier to terminate the crack or the film peeling in the recess 61. Note that the depth of the recess 61 is determined by an etching selection ratio between the interlayer insulating film 60 and the metal film 80 as explained above.

The semiconductor device 100 according to the second embodiment can obtain the same effects as the effects in the first embodiment.

First Modification of the Second Embodiment

Figure 14:
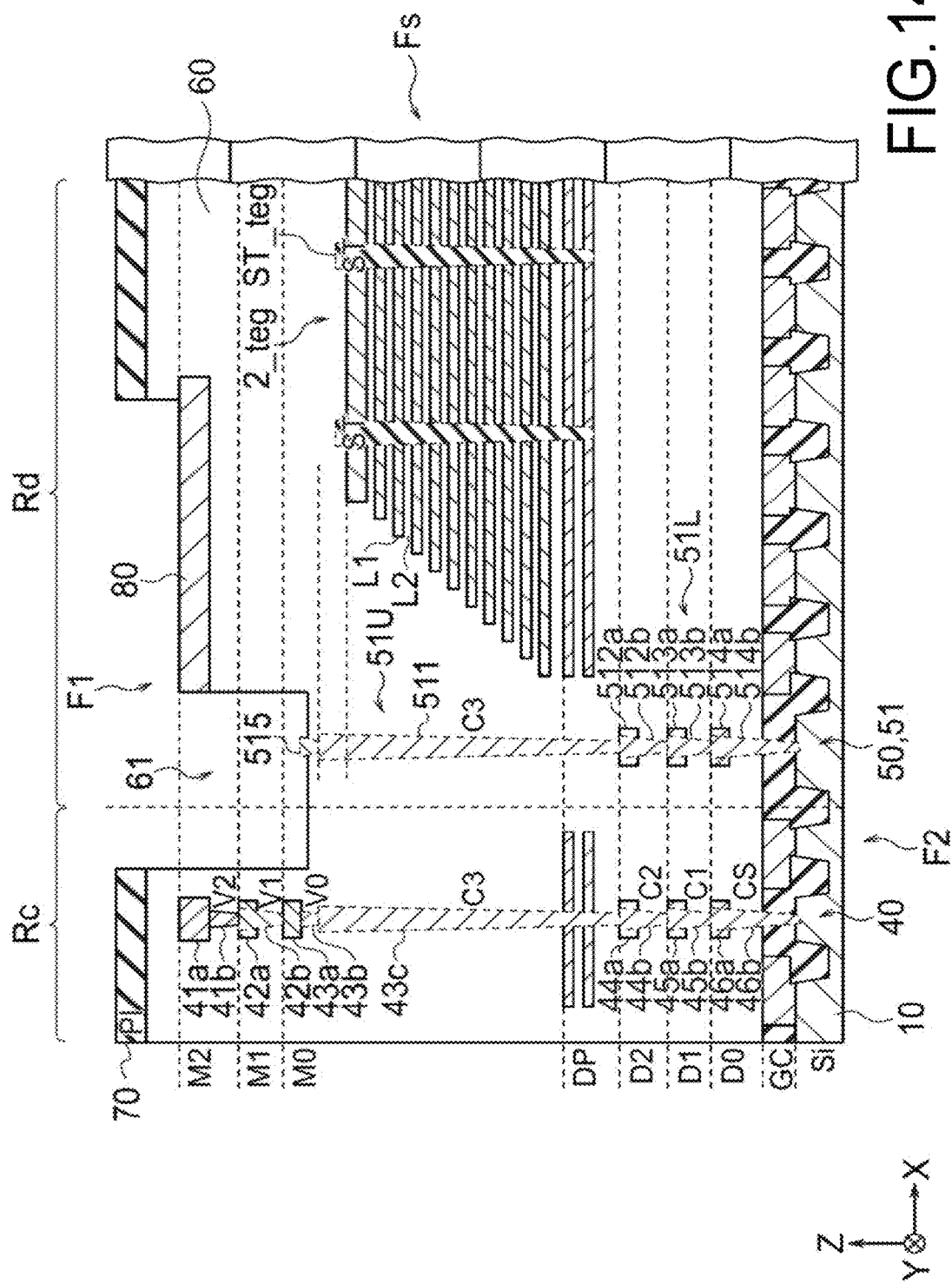
FIG. 14 is a sectional view showing an example of a configuration of a part of a semiconductor wafer according to a first modification of the second embodiment.

FIG. 14 is a sectional view showing an example of a configuration of the semiconductor wafer 10 according to a first modification of the second embodiment. The first modification of the second embodiment is different from the second embodiment in that another via 515 is further provided above the via 511 instead of deepening the recess 61.

In the example shown in FIG. 14, the upper structure body 51U further includes the via 515. The via 515 is provided above the via 511. Consequently, the upper structure body 51U can be extended upward such that the upper end of the upper structure body 51U is exposed from the interlayer insulating film 60.

The via 515 is, for example, covered by a barrier layer. The barrier layer is, for example, a stacked structure film of titanium nitride and titanium. It is possible to suppress, with the barrier layer, a metal material on the inside of the via 515 from being diffused by heat treatment or the like. The material of the via 515 is conductive metal such as tungsten.

The semiconductor device 100 according to the first modification of the second embodiment can obtain the same effects as the effects in the second embodiment.

Third Embodiment

Figure 15:
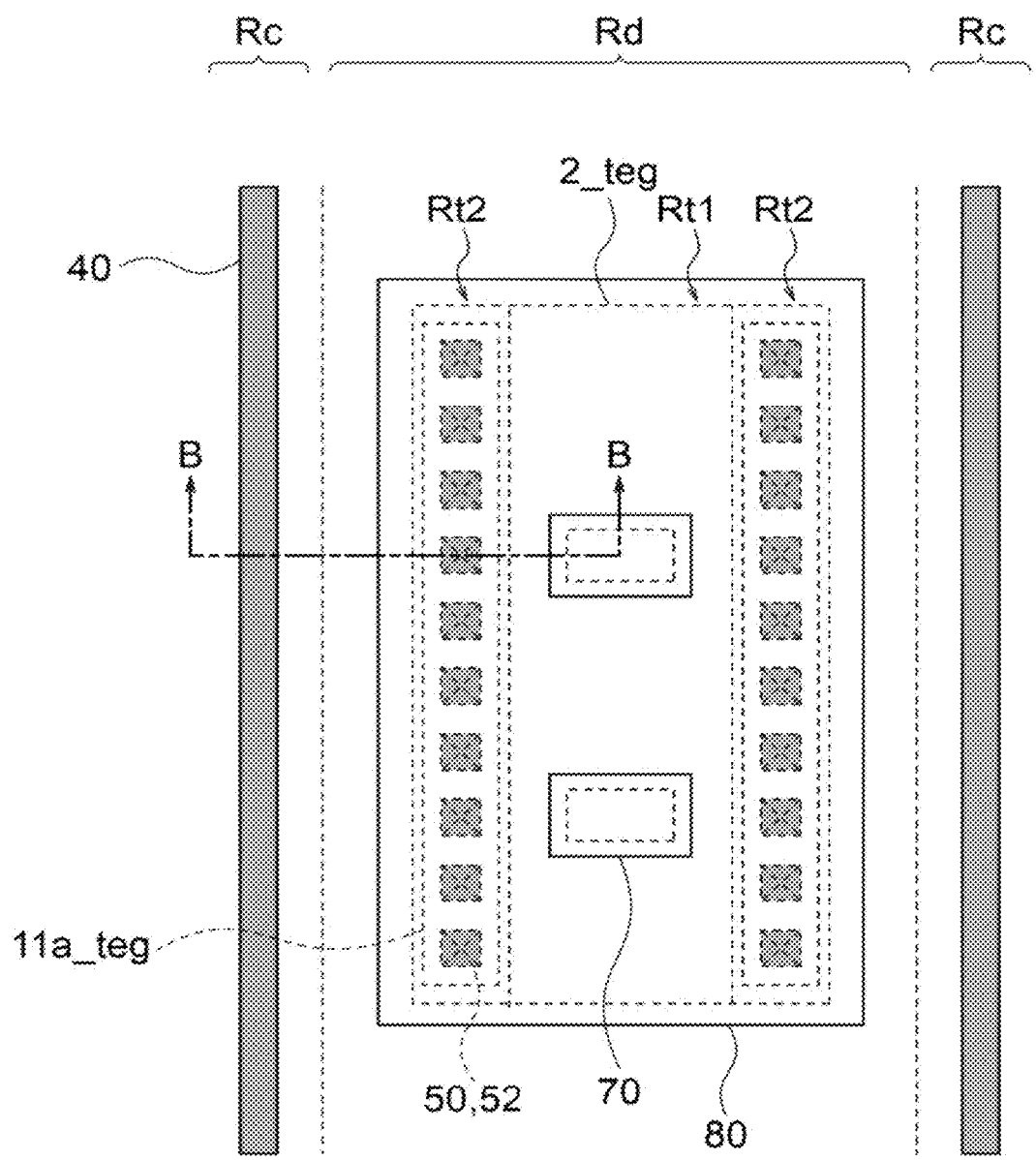
FIG. 15 is a plan view showing an example of a configuration of a part of a semiconductor wafer according to a third embodiment.
Figure 16:
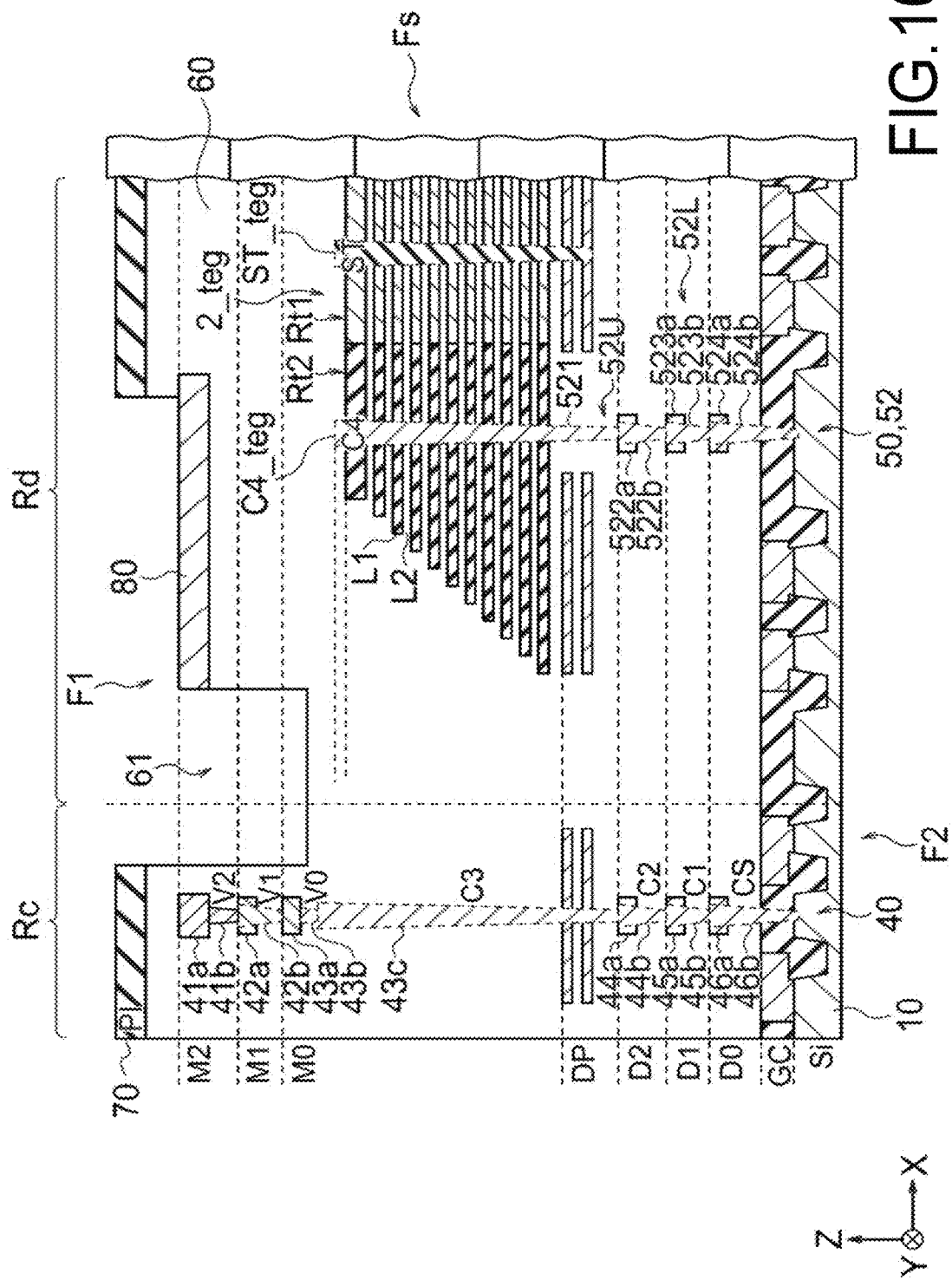
FIG. 16 is a sectional view showing an example of a configuration of a part of the semiconductor wafer according to the third embodiment.

FIG. 15 is a plan view showing an example of a configuration of a part of the semiconductor wafer 10 according to a third embodiment. FIG. 16 is a sectional view showing an example of a configuration of a part of the semiconductor wafer 10 according to the third embodiment. Note that a B-B line in FIG. 15 indicates a cross section corresponding to FIG. 16, which is the sectional view.

The third embodiment is different in the position of the structure body 50 compared with the first embodiment.

As shown in FIG. 16, in the stacked body 2_teg, a sacrificial layer remains without being replaced with a conductive layer in a part of a region. The sacrificial layer is, for example, a silicon nitride film.

The replacement in the stacked body 2_teg is performed by, for example, removing a sacrificial layer from a stacked body in which a plurality of insulating layers 22 and a plurality of sacrificial layers are alternately stacked and filling a metal material in a space where the sacrificial layer is removed. This replacement is performed via the slit ST_teg shown in FIG. 16. Therefore, the replacement of the sacrificial layer in the stacked body 2_teg is performed in a region near the slit ST_teg. On the other hand, the replacement of the sacrificial layer in the stacked body 2_teg is not performed in a region separated a predetermined distance or more from the slit ST_teg. Note that the slit ST_teg extending in the Y direction is omitted in FIG. 15.

In the following explanation, a region where the replacement is performed in the stacked body 2_teg is referred to as a replacement region Rt1. A region where the replacement is not performed in the stacked body 2_teg is referred to as a non-replacement region Rt2. The non-replacement region Rt2 is, for example, a region where a dummy staircase is provided.

A layer L1 in the replacement region Rt1 corresponds to the conductive layer 21. On the other hand, the layer L1 in the non-replacement region Rt2 is a sacrificial layer remaining without being replaced. Note that a layer L2 corresponds to the insulating layer 22 in a region of the replacement region Rt1 and the non-replacement region Rt2.

The structure body 50 includes a structure body 52 disposed to pierce through the stacked body 2_teg in the Z direction. The structure body 52 is disposed to pierce through the non-replacement region Rt2 where the layer L1 is the sacrificial layer in the stacked body 2_teg.

The structure body 52 includes an upper structure body 52U and a lower structure body 52L. The upper structure body 52U indicates a region on a far side from the semiconductor wafer 10 in the structure body 52. The lower structure body 52L indicates a region on a near side to the semiconductor wafer 10 in the structure body 52. The lower structure body 52L is disposed in a position lower than the stacked body 2_teg in the structure body 52.

The upper structure body 52U includes a via 521. The via 521 is provided such that the upper end of the via 521 is in a position higher than the stacked body 2_teg and the lower end of the via 521 is in a position lower than the stacked body 2_teg. The via 521 corresponds to the contact C4_teg provided to pierce through the stacked body 2_teg. Therefore, the via 521 is formed in the same process as a process for forming the contact C4_teg. As shown in FIG. 15, vias 521, which are columnar sections, are, for example, discontinuously provided side by side in the Y direction. The material of the vias 521 is conductive metal such as tungsten.

The lower structure body 52L includes vias 522b, 523b, and 524b and wires 522a, 523a, and 524a. The lower structure body 52L is included in the base section 1_teg shown in FIG. 7.

The vias 522b, 523b, and 524b functioning as one columnar section are, for example, discontinuously provided side by side in the Y direction like the vias 521. By providing the vias 522b, 523b, and 524b in a position lower than the stacked body 2_teg, it is easier to lead the crack or the film peeling in the Z direction. Consequently, it is possible to further suppress the crack or the film peeling from intruding into the semiconductor element. The material of the vias 522b, 523b, and 524b is conductive metal such as tungsten.

The wires 522a, 523a, and 524a are respectively included in the wiring layers D2, D1, and D0. The wires 522a, 523a, and 524a correspond to the wires 11a_teg shown in FIG. 7. As shown in FIGS. 15 and 16, the wires 522a, 523a, and 524a, which are the wires 11a_teg, connect, along the Y direction, the structure bodies 52 adjacent to one another. Consequently, it is possible to further suppress the crack or the film peeling from intruding into the semiconductor element. The material of the wires 522a, 523a, and 524a is conductive metal such as tungsten.

Therefore, the lower structure body 52L includes the vias 522b, 523b, and 524b, which are the columnar sections, and the wires connecting the columnar sections (the vias 522b, 523b, and 524b) adjacent to one another. According to a combination of the columnar sections and the wires, the lower structure body 52L has, for example, a mesh shape when viewed from the X direction in FIGS. 15 and 16. Note that the wires 522a and 523a and the via 522b may have a via chain structure extending in the Y direction.

The structure body 52 does not always need to include the lower structure body 52L.

Note that, in the example shown in FIG. 16, the interlayer insulating film 60 is provided to be adjacent to the stacked body 2_teg in the X direction. However, not only this, but the stacked body 2_teg may be provided, for example, on substantially the entire surface of the dicing region Rd. Even in this case, the region separated the predetermined distance or more from the slit ST_teg in the stacked body 2_teg is the non-replacement region Rt2.

As in the third embodiment, the structure body 52 may be disposed to pierce through the stacked body 2_teg.

The semiconductor device 100 according to the third embodiment can obtain the same effects as the effects in the first embodiment. The first modification and the second modification of the first embodiment and the second embodiment may be combined with the semiconductor device 100 according to the third embodiment. That is, the structure bodies 52 may be provided in a plurality of rows or may include plate-like sections.

First Modification of the Third Embodiment

Figure 17:
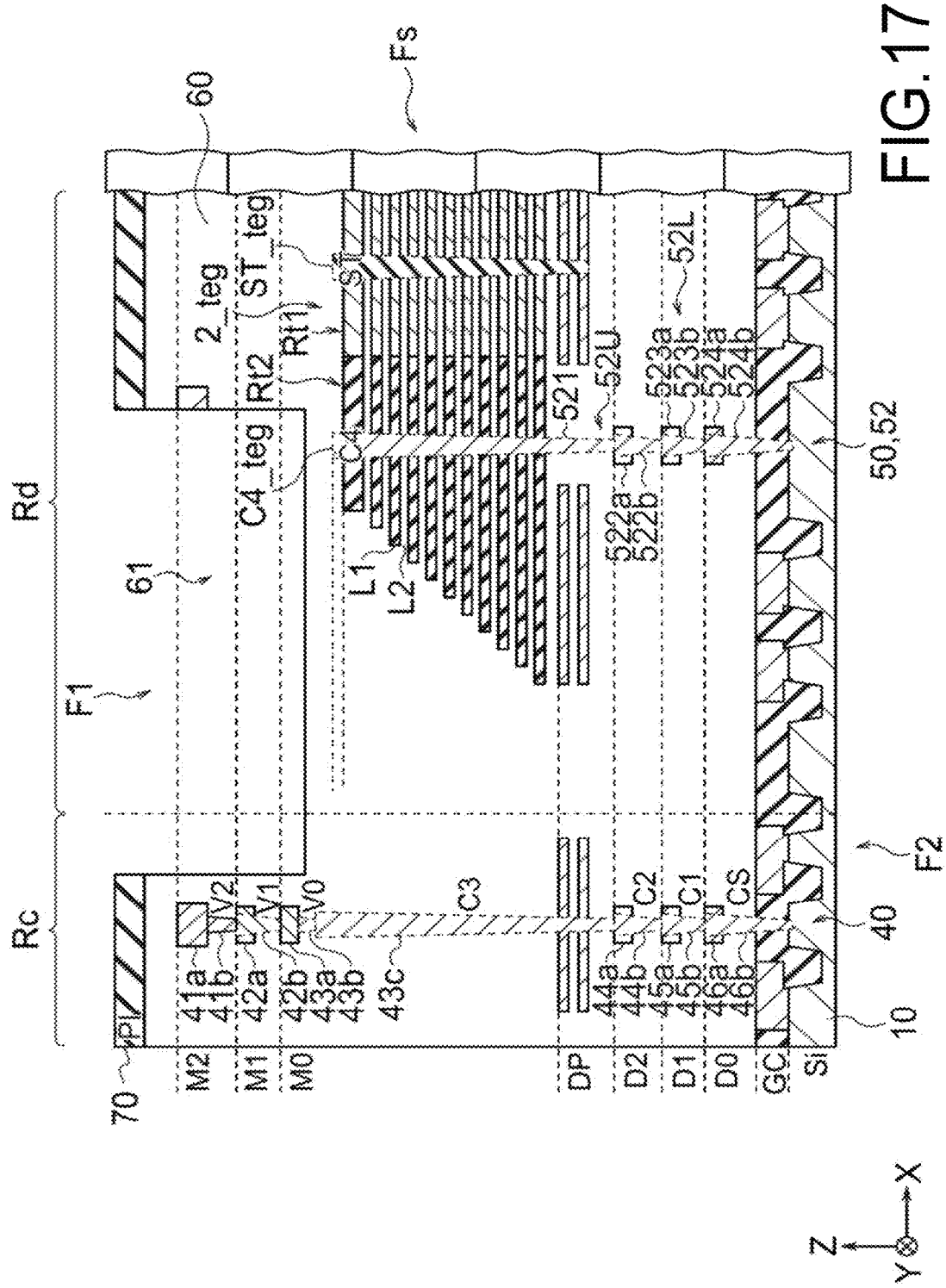
FIG. 17 is a sectional view showing an example of a configuration of a part of a semiconductor wafer according to a first modification of the third embodiment.

FIG. 17 is a sectional view showing an example of a configuration of a part of the semiconductor wafer 10 according to a first modification of the third embodiment. The first modification of the third embodiment is different from the third embodiment in that the recess 61 is provided above the structure body 52.

In the example shown in FIG. 17, the interlayer insulating film 60 includes the recess 61 above the structure body 52. Consequently, it is possible to terminate, in a shorter distance, the crack or the film peeling led upward in the structure body 52.

Compared with FIG. 16 in the third embodiment, the metal film 80 above the stacked body 2_teg is not provided. That is, since the recess 61 is provided above the structure body 52, the metal film 80 above the stacked body 2_teg may not be provided.

The semiconductor device 100 according to the first modification of the third embodiment can obtain the same effects as the effects in the third embodiment.

Fourth Embodiment

Figure 18:
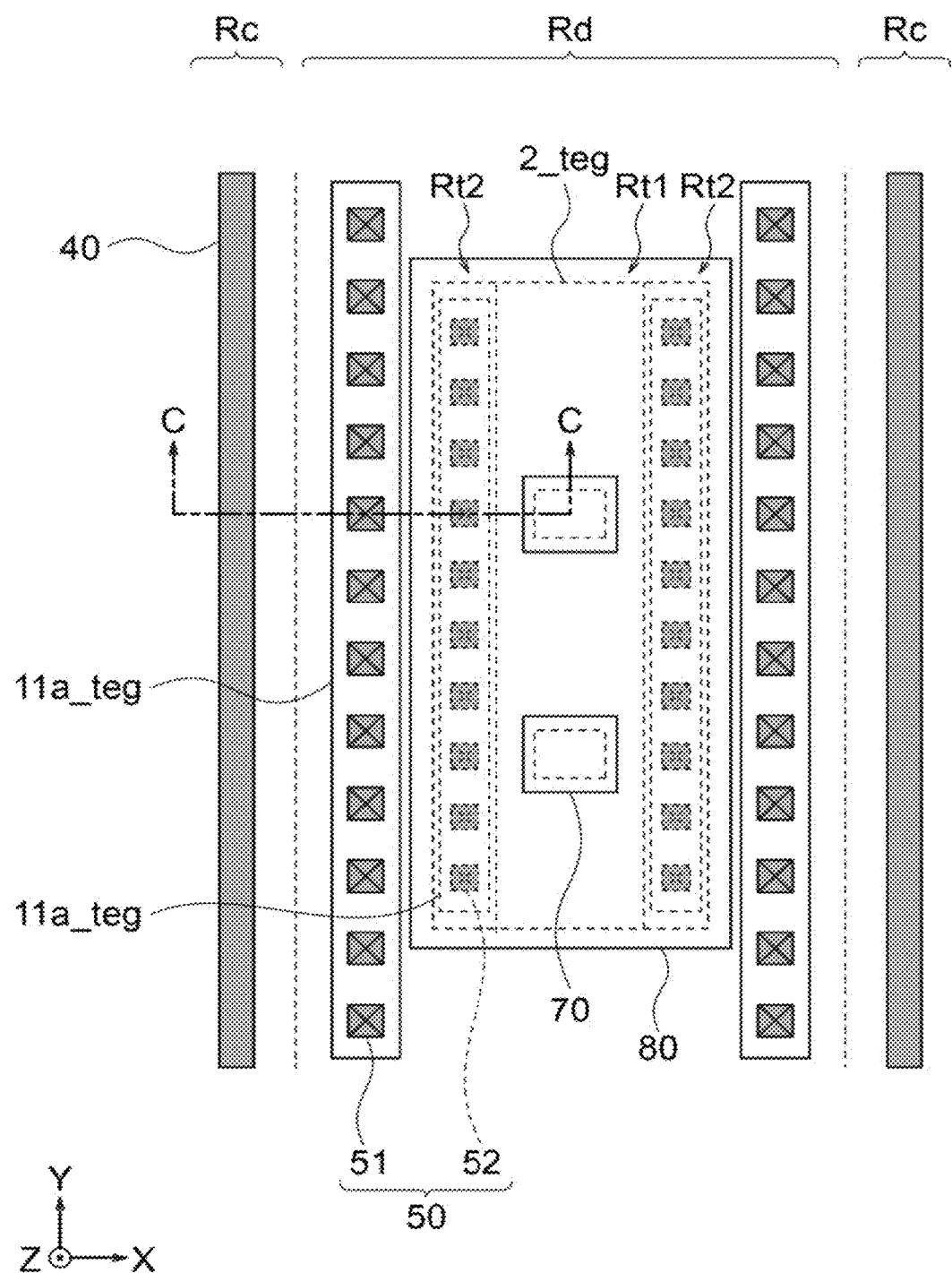
FIG. 18 is a plan view showing an example of a configuration of a part of a semiconductor wafer according to a fourth embodiment.
Figure 19:
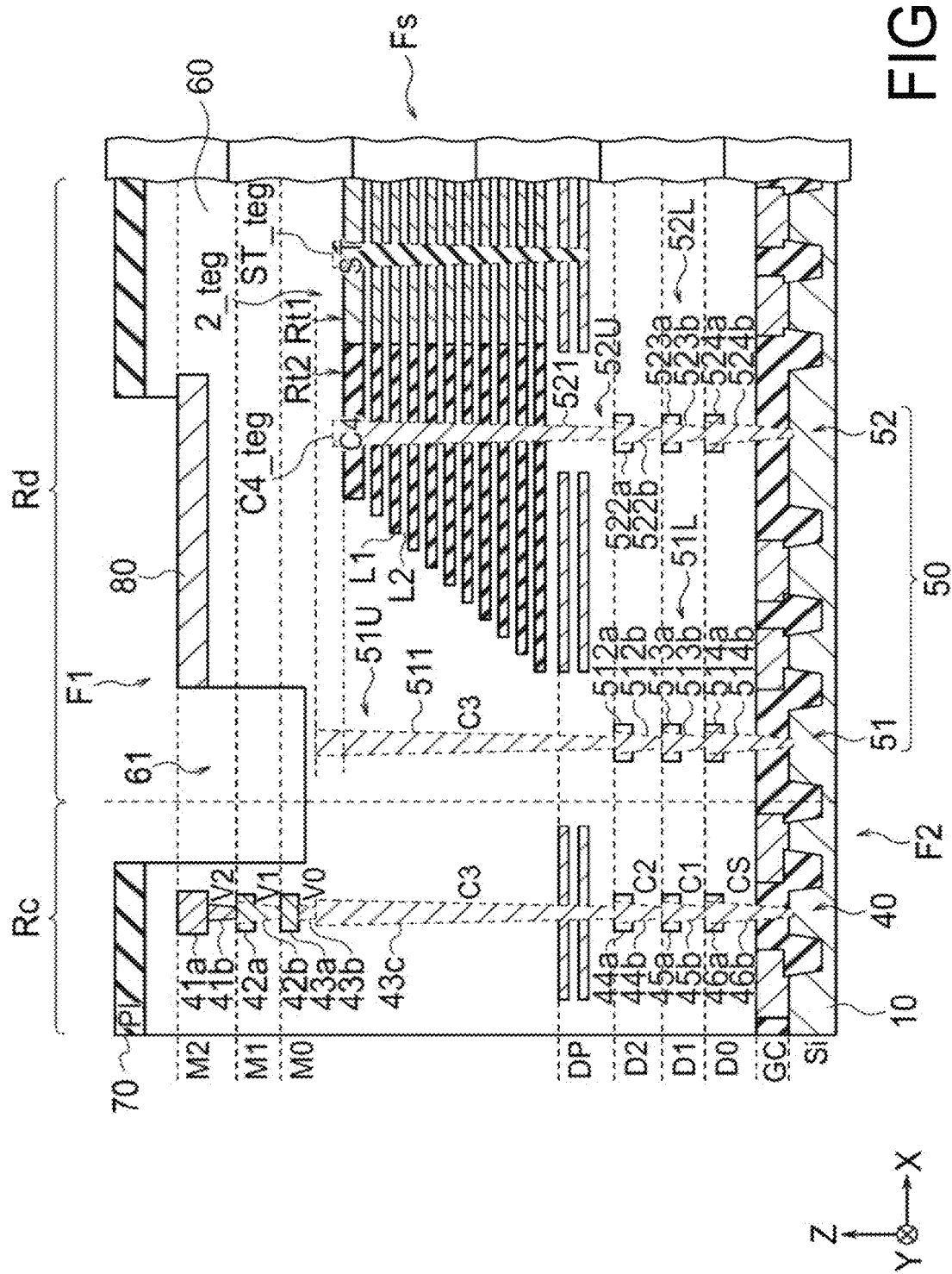
FIG. 19 is a sectional view showing an example of a configuration of a part of the semiconductor wafer according to the fourth embodiment.

FIG. 18 is a plan view showing an example of a configuration of a part of the semiconductor wafer 10 according to a fourth embodiment. FIG. 19 is a sectional view showing an example of a configuration of a part of the semiconductor wafer 10 according to the fourth embodiment. Note that a C-C line in FIG. 18 indicates a cross section corresponding to FIG. 19, which is the sectional view.

In the fourth embodiment, both of the structure body 51 and the structure body 52 are provided. Therefore, the fourth embodiment is a combination of the first embodiment and the third embodiment.

The structure body 50 includes the structure body 51 disposed between the semiconductor element and the stacked body 2_teg and the structure body 52 disposed to pierce through the stacked body 2_teg in the Z direction.

Note that via diameters may be different between the via 511, which is the contact C3, and the via 521, which is the contact C4_teg.

The semiconductor device 100 according to the fourth embodiment can obtain the same effects as the effects in the first embodiment and the third embodiment. The first modification and the second modification of the first embodiment and the second embodiment may be combined with the semiconductor device 100 according to the fourth embodiment.

Fifth Embodiment

Figure 20:
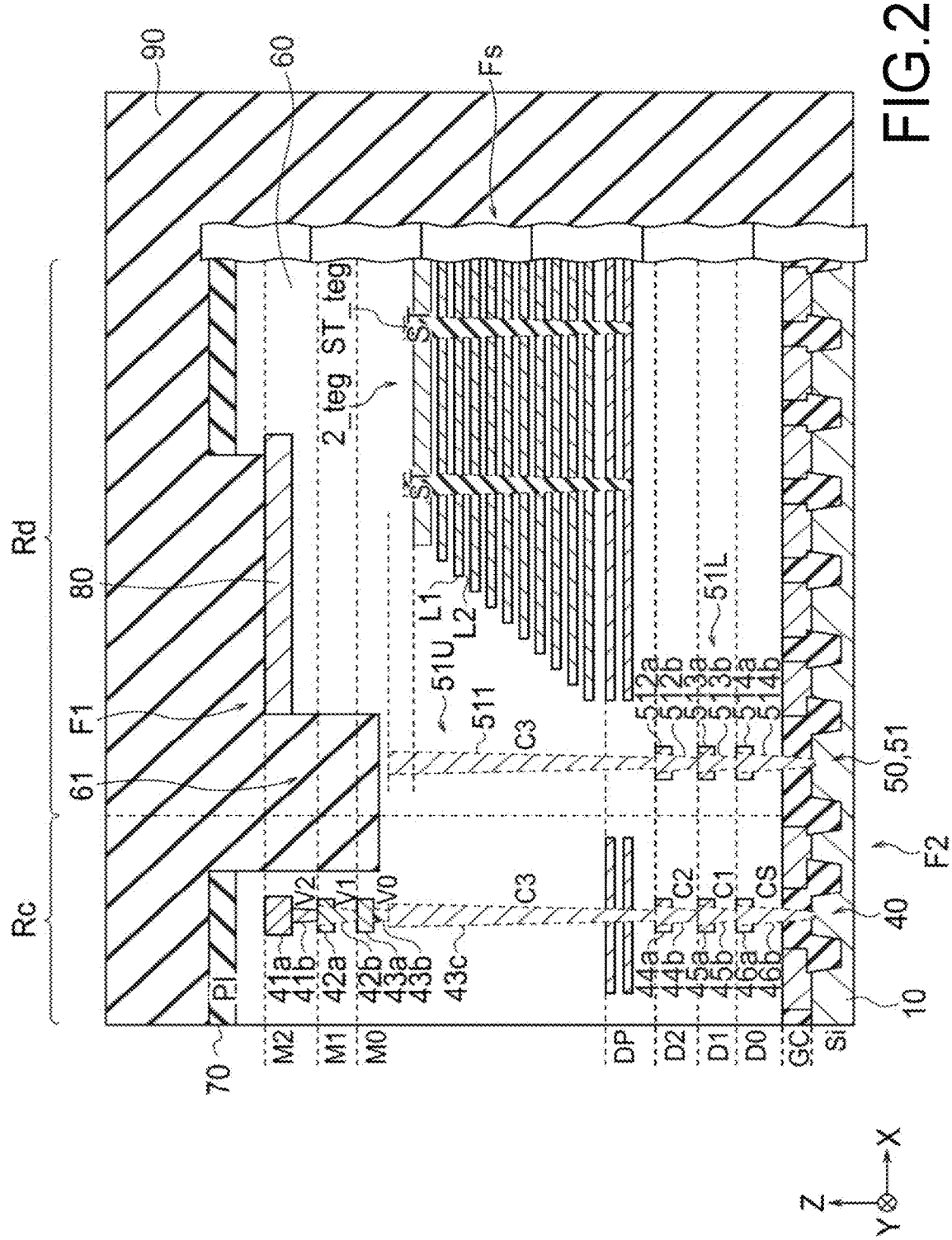
FIG. 20 is a sectional view showing an example of a configuration of a part of a semiconductor chip according to a fifth embodiment.

FIG. 20 is a sectional view showing an example of a configuration of a part of the semiconductor chip CH according to a fifth embodiment. The fifth embodiment is different from the first embodiment in that the semiconductor wafer 10 is singulated into the semiconductor chip CH and the semiconductor chip CH is sealed by mold resin.

The semiconductor chip CH further includes a resin layer 90. In the example shown in FIG. 20, the resin layer 90 covers the surface F1 and the side surface Fs, which is the cut surface. The resin layer 90 also covers the chip region Rc of the surface F1 not shown in FIG. 20.

Next, a manufacturing process from the semiconductor wafer 10 shown in FIGS. 9 and 10 to the semiconductor chip CH shown in FIG. 20 will be explained.

First, in FIGS. 9 and 10, the semiconductor wafer 10 is cut along the dicing region Rd to thereby be singulated into the semiconductor chip CH.

Subsequently, the semiconductor chip CH is mounted on a wiring board. The semiconductor chip CH is mounted such that the surface F2 is opposed to the wiring board.

Subsequently, a pad exposed in the chip region Rc is electrically connected to the wiring board. The connection of the pad and the wiring board is performed by, for example, wire bonding.

Subsequently, the resin layer 90 that covers (seals) the semiconductor chip CH and a wire formed by the wire bonding is formed.

The semiconductor device 100 according to the fifth embodiment can obtain the same effects as the effects in the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising a semiconductor chip including a substrate, a first surface of the substrate, and a side surface rising from an edge of the first surface, wherein
   the semiconductor chip further includes:
      a memory cell array including a plurality of first insulating layers and a plurality of first conducting layers stacked alternately in a normal direction of the first surface;
      a first stacked body provided at an outer peripheral end portion of the semiconductor chip when viewed from the normal direction and including a plurality of first layers and a plurality of second layers alternately stacked in the normal direction;
      a first resin that overlaps at least a portion of the first stacked body, when viewed from the normal direction;
      a second resin separated from the first resin and located closer to the center side of the semiconductor chip than the first resin, when viewed from the normal direction;
      a first structure body provided in at least a part between the first resin and the second resin when viewed from the normal direction and extending from a position higher than the first stacked body to a position lower than the first stacked body; and
      a first control circuit that is provided below the memory cell array and that overlaps at least a portion of the memory cell array when viewed from the normal direction.

2. The semiconductor device according to claim 1, further comprising a second structure body that overlaps at least a portion of the second resin, when viewed from the normal direction and that extends from a position higher than the first stacked body to a position lower than the first stacked body.

3. The semiconductor device according to claim 1, further comprising a third structure body disposed to pierce through the first stacked body in the normal direction.

4. The semiconductor device according to claim 1, the first stacked body including a first portion where the first layer is the first insulating layer and the second layer is the first conductive layer, when viewed from the normal direction.

5. The semiconductor device according to claim 1, wherein the first structure body includes a plurality of first columnar sections extending in the normal direction.

6. The semiconductor device according to claim 5, wherein the plurality of first columnar sections are disposed in a plurality of rows along an outer periphery of the memory cell array when viewed from the normal direction.

7. The semiconductor device according to claim 6, wherein the plurality of first columnar sections are disposed to be alternate, when viewed from the normal direction, along the outer periphery of the memory cell array, between rows adjacent to each other.

8. The semiconductor device according to claim 1, wherein the first structure body includes a first plate-like section extending in the normal direction and extending along an outer periphery of the memory cell array.

9. The semiconductor device according to claim 1, wherein a lower part of the first structure body lower than the first stacked body in the first structure body includes:
a plurality of second columnar sections extending in the normal direction; and
a wire connecting the second columnar sections.

10. The semiconductor device according to claim 1, wherein a lower part of the first structure body lower than the first stacked body in the first structure body includes a second plate-like section extending in the normal direction and extending along an outer periphery of the memory cell array.

11. The semiconductor device according to claim 1, wherein
the semiconductor chip further includes an insulating film covering the first stacked body and the first structure body, and
the insulating film includes a recess above the first structure body.

12. The semiconductor device according to claim 1, wherein
the semiconductor chip further includes an insulating film covering the first stacked body and the first structure body, and
an upper end of the first structure body is exposed from the insulating film.

13. The semiconductor device according to claim 1, wherein the semiconductor chip further includes a metal film provided above the first stacked body and disposed apart from the first structure body when viewed from the normal direction.

14. The semiconductor device according to claim 1, wherein the semiconductor chip further includes a protection film provided above the first stacked body and disposed apart from the first structure body when viewed from the normal direction.

15. The semiconductor device according to claim 1, wherein
a lower end of the first structure body reaches the substrate.

16. The semiconductor device according to claim 1, wherein the first stacked body is disposed to be exposed in at least a part of the side surface.

17. The semiconductor device according to claim 1, wherein
the first stacked body is disposed apart from the substrate above the substrate.

18. The semiconductor device according to claim 1, wherein
the semiconductor chip further includes an edge seal section surrounding an outer periphery of the memory cell array when viewed from the normal direction, and
the first structure body is provided between the edge seal section and the side surface when viewed from the normal direction.

19. The semiconductor device according to claim 4, the first stacked body including a second portion where the first layer is the first insulating layer and the second layer is a second insulating layer, when viewed from the normal direction.

20. The semiconductor device according to claim 13, wherein a first distance, which is a distance between the first surface and the metal film, is shorter than a second distance, which is a distance between the first surface and the first resin, and longer than a third distance, which is a distance between the first surface and a top of the first structure body along the normal direction.

* * * * *